US011393880B2

(12) United States Patent
Jang et al.

(10) Patent No.: US 11,393,880 B2
(45) Date of Patent: Jul. 19, 2022

(54) DISPLAY DEVICE AND METHOD OF FABRICATING THE SAME

(71) Applicant: Samsung Display Co., Ltd., Yongin-Si (KR)

(72) Inventors: Chang-Soon Jang, Seoul (KR); Keunchan Oh, Hwaseong-si (KR); Sun-kyu Joo, Suwon-si (KR); Byungchul Kim, Suwon-si (KR); Inok Kim, Osan-si (KR); Inseok Song, Pocheon-si (KR); Gakseok Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/522,526

(22) Filed: Jul. 25, 2019

(65) Prior Publication Data

US 2020/0152704 A1    May 14, 2020

(30) Foreign Application Priority Data

Nov. 9, 2018    (KR) .................. 10-2018-0137558

(51) Int. Cl.
*H01L 27/32* (2006.01)
*H01L 51/56* (2006.01)

(52) U.S. Cl.
CPC ........ *H01L 27/322* (2013.01); *H01L 27/3246* (2013.01); *H01L 27/3272* (2013.01); *H01L 51/56* (2013.01); *H01L 2251/558* (2013.01)

(58) Field of Classification Search
CPC .............. H01L 27/322; H01L 27/3246; H01L 51/5284; H01L 27/3211
See application file for complete search history.

(56) References Cited

U.S. PATENT DOCUMENTS

2005/0093435 A1* 5/2005 Suh .................. H01L 27/322
                                               313/504
2006/0012288 A1* 1/2006 Terakado .......... H01L 27/322
                                               313/503

(Continued)

FOREIGN PATENT DOCUMENTS

KR    10-2017-0099016    8/2017

*Primary Examiner* — Samuel A Gebremariam
*Assistant Examiner* — Jonas T Beardsley
(74) *Attorney, Agent, or Firm* — H.C. Park & Associates, PLC

(57) ABSTRACT

A display device including a base layer including a thin film transistor, a pixel definition layer including an opening, first to third organic light emitting elements each including a first electrode, a second electrode, and a light emitting layer therebetween, an encapsulation member including a first inorganic layer covering the organic light emitting elements, a second inorganic layer disposed thereon, a first color conversion pattern disposed between the inorganic layers and overlapping the first organic light emitting element, and a second color conversion pattern disposed between the inorganic layers and overlapping the second organic light emitting element, and first and second color filter patterns having different colors from each other and overlapping the first and second color conversion patterns, respectively, in which colors of light emitted from the first and second color conversion patterns are substantially the same as colors of the first and second color filter patterns, respectively.

15 Claims, 23 Drawing Sheets

(56) References Cited

U.S. PATENT DOCUMENTS

| | | | |
|---|---|---|---|
| 2014/0312339 A1* | 10/2014 | Fujita | H01L 27/322 257/40 |
| 2016/0247862 A1* | 8/2016 | Song | H01L 27/3246 |
| 2017/0125740 A1* | 5/2017 | Lee | H01L 27/322 |
| 2017/0240728 A1 | 8/2017 | Lee et al. | |
| 2018/0067358 A1 | 3/2018 | Li | |
| 2019/0189969 A1* | 6/2019 | Youn | H01L 51/5265 |

* cited by examiner

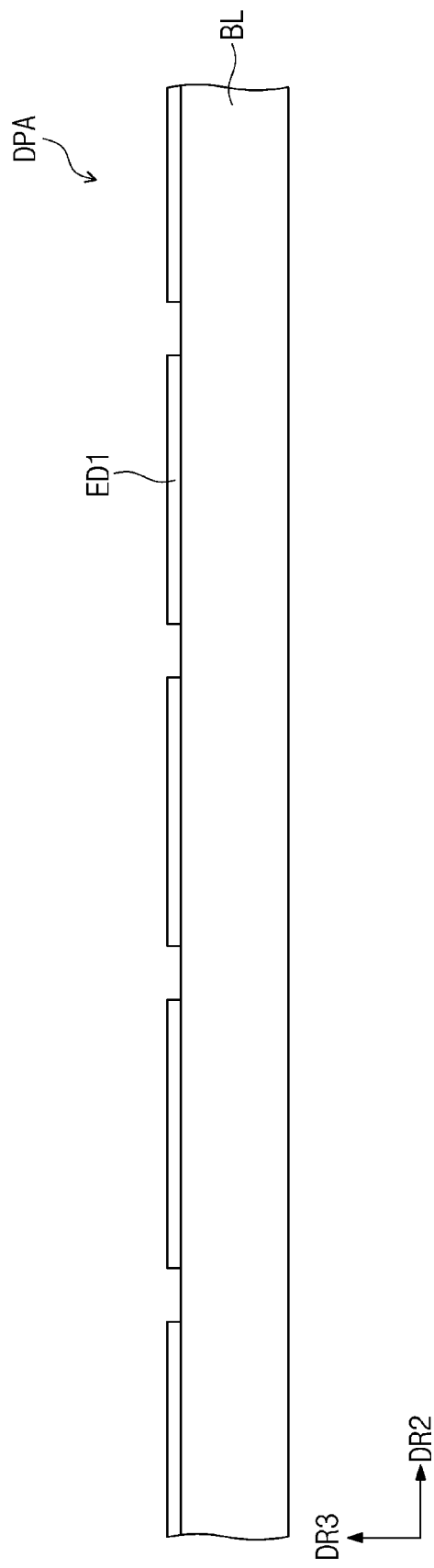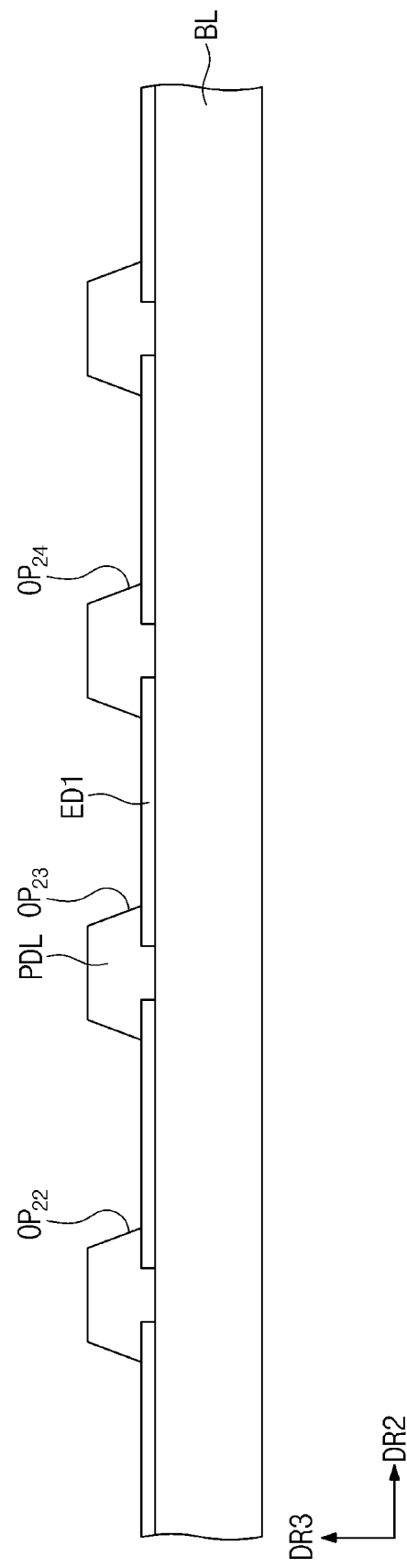

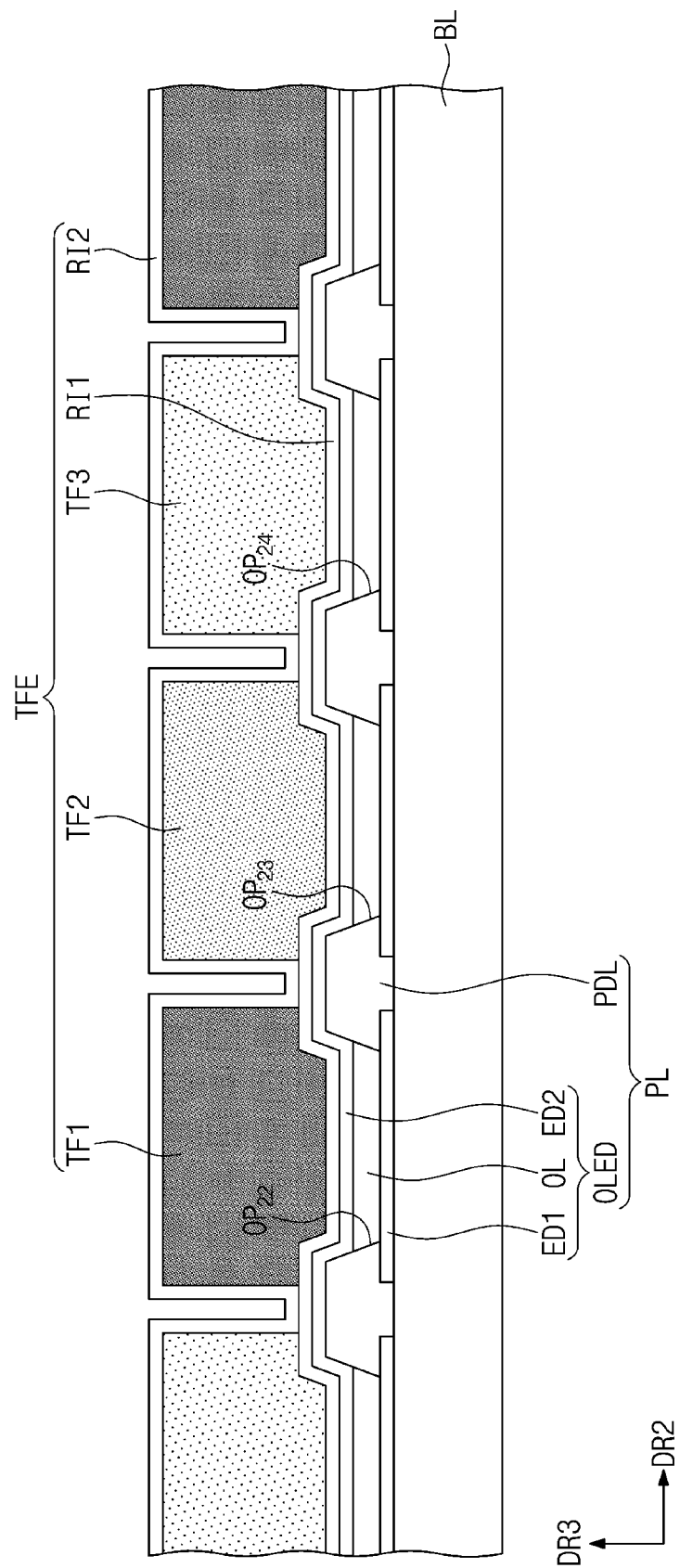

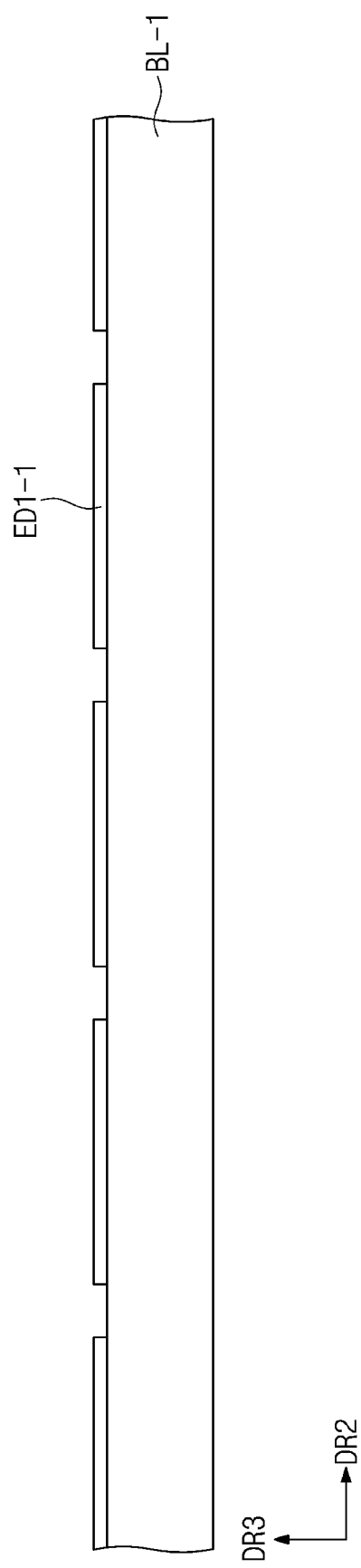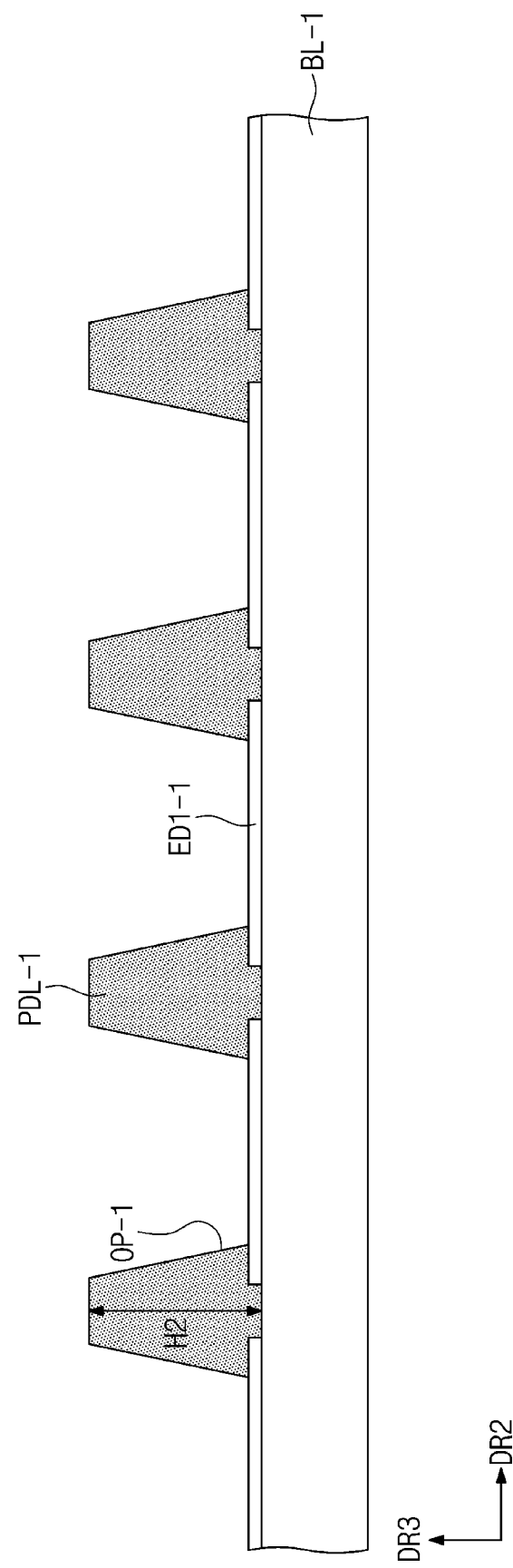

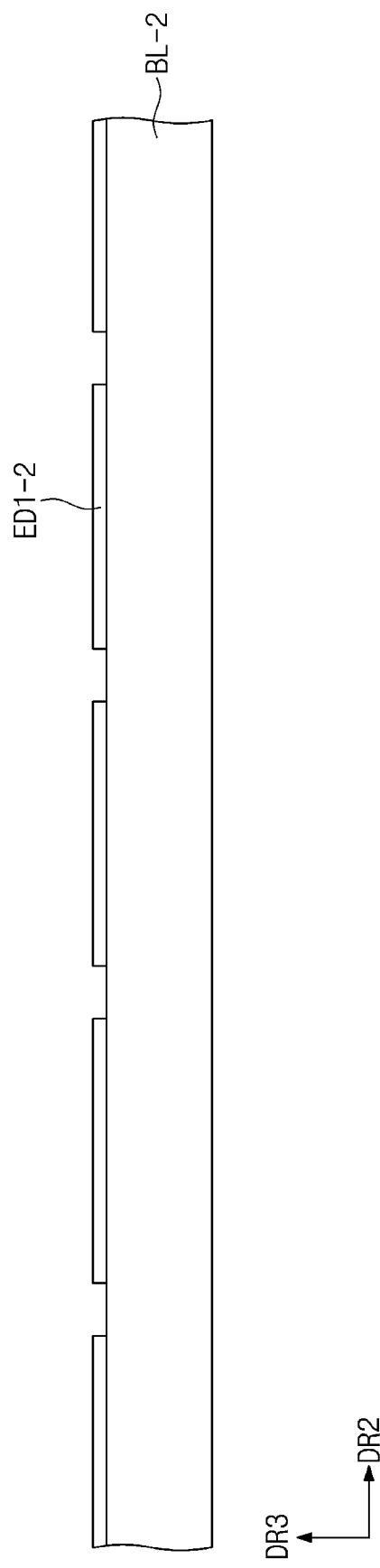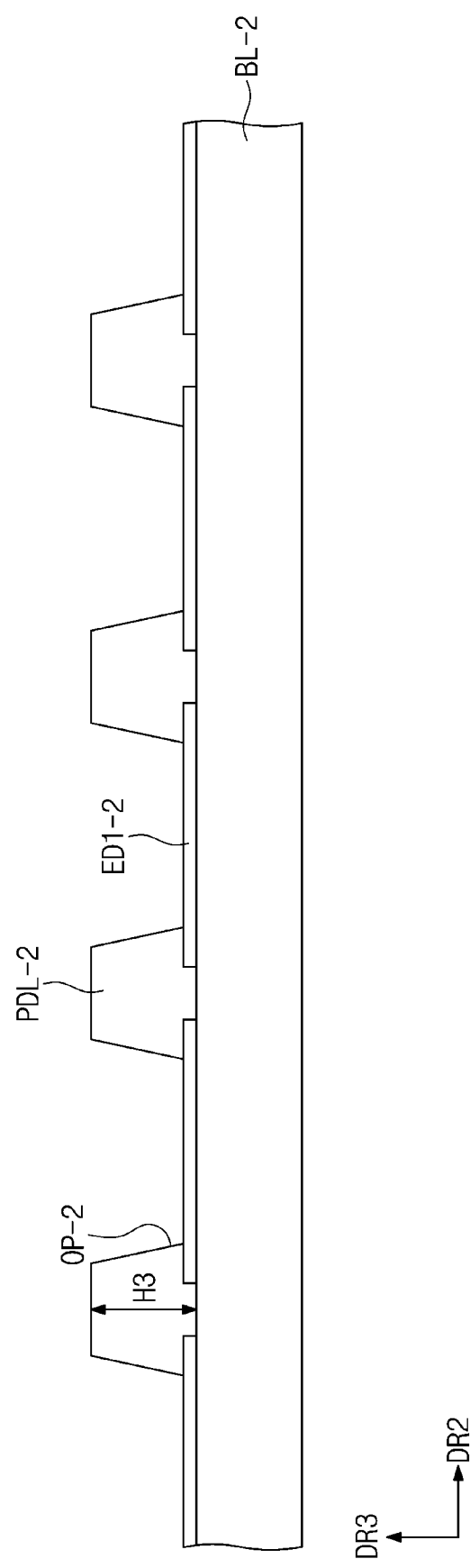

DISPLAY DEVICE AND METHOD OF FABRICATING THE SAME

CROSS-REFERENCE TO RELATED APPLICATION

This application claims priority from and the benefit of Korean Patent Application No. 10-2018-0137558, filed on Nov. 9, 2018, which is hereby incorporated by reference for all purposes as if fully set forth herein.

BACKGROUND

Field

Exemplary embodiments of the invention relate generally to a display device with improved reliability and, more specifically, to a display device with improved color reproduction characteristics and a method of fabricating the same.

Discussion of the Background

Various flat panel display devices have been developed, such as liquid crystal display (LCD), organic light emitting display (OLED), plasma display panel (PDP), quantum dot display, field emission display (FED), and electrophoretic display (EPD) devices. Each of the flat panel display devices includes a flat display panel, which is used to display an image. The flat display panel includes a pair of combined transparent insulating substrates, with an intervening layer (e.g., self light-emitting, polarization, or optical layer) therebetween. The OLED device includes a self-luminous organic light emitting diode, which is disposed in each sub pixel and used to display an image. Since the OLED device does not require an additional light source nor a structure for assembling the light source with the display panel, the OLED device has an advantage of thin thickness and light weight. As such, the OLED device is emerging as a next-generation display device. In general, the OLED device includes an encapsulation member, which may cover an organic light emitting element to prevent moisture and oxygen from entering the organic light emitting element. Furthermore, the OLED device may include a color filter member for color reproduction characteristics.

The above information disclosed in this Background section is only for understanding of the background of the inventive concepts, and, therefore, it may contain information that does not constitute prior art.

SUMMARY

A display device constructed according to exemplary implementations of the invention has improved color reproduction characteristics. In addition, a method of fabricating a display device according to exemplary embodiments provides a cost- and time-effective method for fabricating the display device.

Additional features of the inventive concepts will be set forth in the description which follows, and in part will be apparent from the description, or may be learned by practice of the inventive concepts.

A display device according to an exemplary embodiment includes a base layer including a thin film transistor, a pixel definition layer disposed on the base layer and including an opening, first, second, and third organic light emitting elements disposed on the base layer, each of the first, second, and third organic light emitting elements including a first electrode exposed in the opening, a second electrode disposed on the first electrode, and a light emitting layer disposed between the first electrode and the second electrode, an encapsulation member including a first inorganic layer covering the first, second, and third organic light emitting elements, a second inorganic layer disposed on the first inorganic layer, a first color conversion pattern disposed between the first and second inorganic layers and overlapping the first organic light emitting element, and a second color conversion pattern spaced apart from the first color conversion pattern, disposed between the first and second inorganic layers, and overlapping the second organic light emitting element, and a color filter member disposed on the encapsulation member, the color filter member including first and second color filter patterns having different colors from each other and overlapping the first and second color conversion patterns, respectively, in which a color of light emitted from the first color conversion pattern is substantially the same as a color of the first color filter pattern, and a color of light emitted from the second color conversion pattern is substantially the same as a color of the second color filter pattern.

The first inorganic layer and the second inorganic layer may contact each other in a gap region formed between the first and second color conversion patterns.

The display device may further include a light-blocking pattern disposed in the gap region.

The light-blocking pattern may be disposed on the second inorganic layer and may be covered by the color filter member.

A the light-blocking pattern may covered with the first inorganic layer.

The light-blocking pattern may overlap both of the first and second color filter patterns.

The pixel definition layer may include a light blocking material, and a thickness of the pixel definition layer measured from the base layer may be in a range of about 3 μm to about 10 μm.

The encapsulation member may further include a light transmitting pattern overlapping the third organic light emitting element and spaced apart from the first and second color conversion patterns, the color filter member may further include a third color filter pattern overlapping the light transmitting pattern and disposed on a same layer as the first and second color filter patterns, and each of the light transmitting pattern and the third color filter pattern may be configured to emit blue light.

A display device according to another exemplary embodiment includes a base layer including a thin film transistor, a pixel definition layer disposed on the base layer and including an opening, first and second organic light emitting elements disposed on the base layer, each of the first and second organic light emitting elements including a first electrode exposed in the opening, a second electrode disposed on the first electrode, and a light emitting layer disposed between the first electrode and the second electrode, an encapsulation member including a first inorganic layer covering the first and second organic light emitting elements, a second inorganic layer disposed on the first inorganic layer, a first color conversion pattern overlapping the first organic light emitting element and disposed between the first and second inorganic layers, and a second color conversion pattern spaced apart from the first color conversion pattern, disposed between the first and second inorganic layers, and overlapping the second organic light emitting element, and a color filter member disposed on the encapsulation member, the color filter member including first and second color filter patterns having different colors from each other and overlapping the first and second color conversion patterns, respectively, in which the first inorganic layer and the second inorganic layer contact each other in a gap region between the first and second color conversion patterns.

A color of light emitted from the first color conversion pattern may be substantially the same as a color of the first color filter pattern, and a color of light emitted from the second color conversion pattern is substantially the same as a color of the second color filter pattern.

The display device may further include a light-blocking pattern disposed in the gap region.

The light-blocking pattern may be covered with the first inorganic layer.

The light-blocking pattern may overlap both of the first and second color filter patterns.

The pixel definition layer may include a light blocking material, and a thickness of the pixel definition layer measured from the base layer may be in a range from about 3 μm to about 10 μm.

The first and second color conversion patterns may include a quantum dot.

A method of fabricating a display device according to yet another exemplary embodiment includes the steps of providing a preliminary display panel including a base layer, a pixel definition layer including an opening, and an organic light emitting element configured to display light through the opening, forming a first inorganic layer on the preliminary display panel, forming a first color conversion pattern, a second color conversion pattern, and a light transmitting pattern spaced apart from each other on the first inorganic layer, forming a second inorganic layer on the first color conversion pattern, the second color conversion pattern, and the light transmitting pattern, and forming first, second, and third color filter patterns on the second inorganic layer to overlap the first color conversion pattern, the second color conversion pattern, and the light transmitting pattern, respectively.

The steps may further include forming a light-blocking pattern between the first color conversion pattern, the second color conversion pattern, and the light transmitting pattern, respectively, before the step of forming the first, second, and third color filter patterns and after the step of forming the second inorganic layer.

The pixel definition layer may be formed by coating an organic material including a light blocking material on the base layer.

The steps may further include forming a light-blocking pattern overlapping the pixel definition layer on the preliminary display panel, before the step of forming the first inorganic layer.

The steps may further include forming a light-blocking pattern between the first color conversion pattern, the second color conversion pattern, and the light transmitting pattern after the step of forming the first, second, and third color filter patterns, in which the light-blocking pattern may extend onto the first, second, and third color filter patterns to cover a portion of each of the first, second, and third color filter patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 8A, 8B, 8C, 8D, 8E, 8F, 8G, 8H, and 8I are cross-sectional views illustrating a method of fabricating a display device according to an exemplary embodiment.

FIGS. 9A, 9B, and 9C are cross-sectional views illustrating a method of fabricating a display device according to an exemplary embodiment.

FIGS. 10A, 10B, 10C, and 10D are cross-sectional views illustrating a method of fabricating a display device according to an exemplary embodiment.

DETAILED DESCRIPTION

Figure 1:
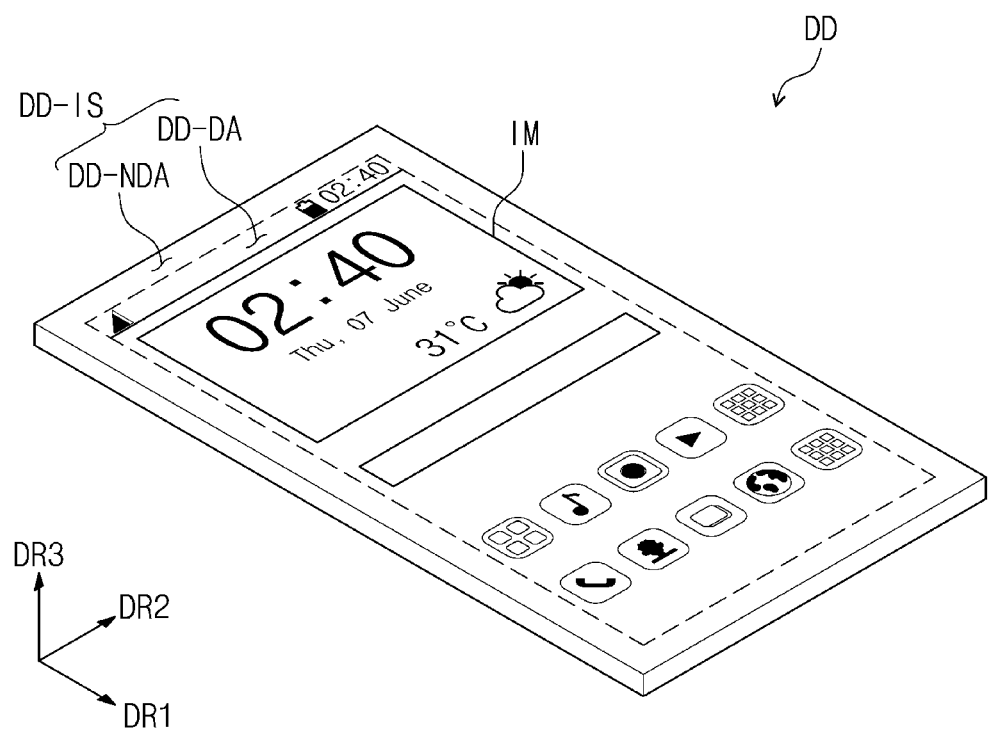
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
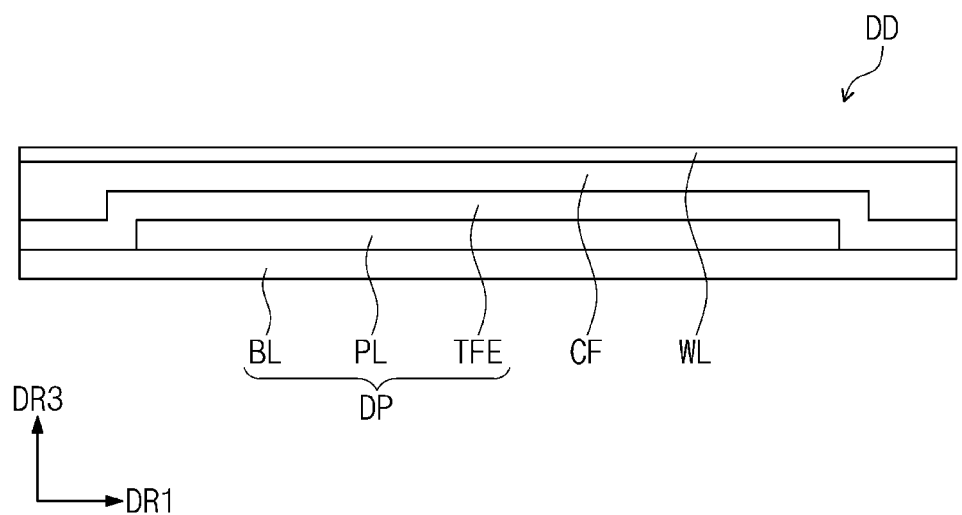
FIG. 2 is a cross-sectional view of a display device according to an exemplary embodiment.
Figure 3A:
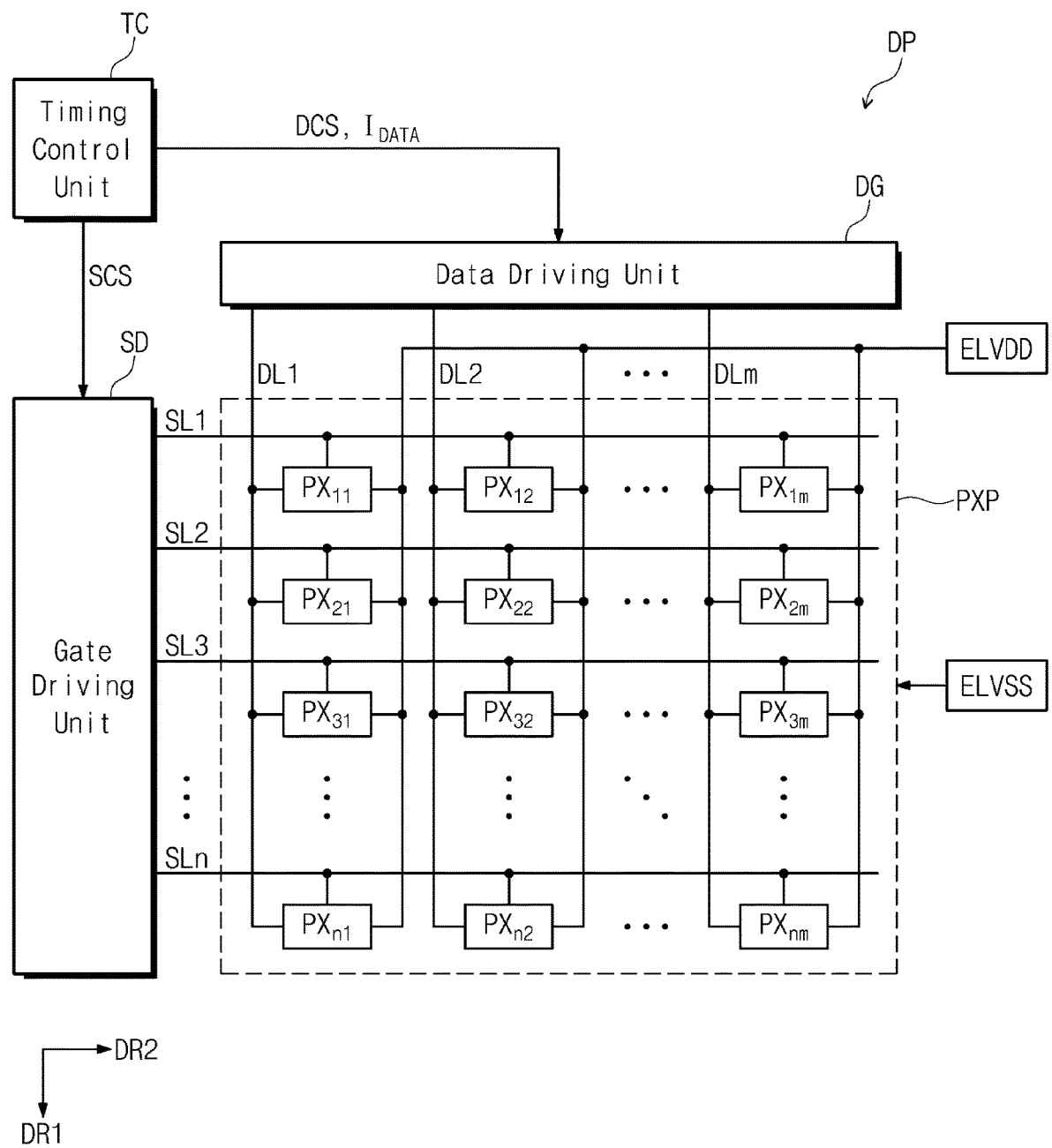
FIG. 3A is a block diagram of a display device according to an exemplary embodiment.
Figure 3B:
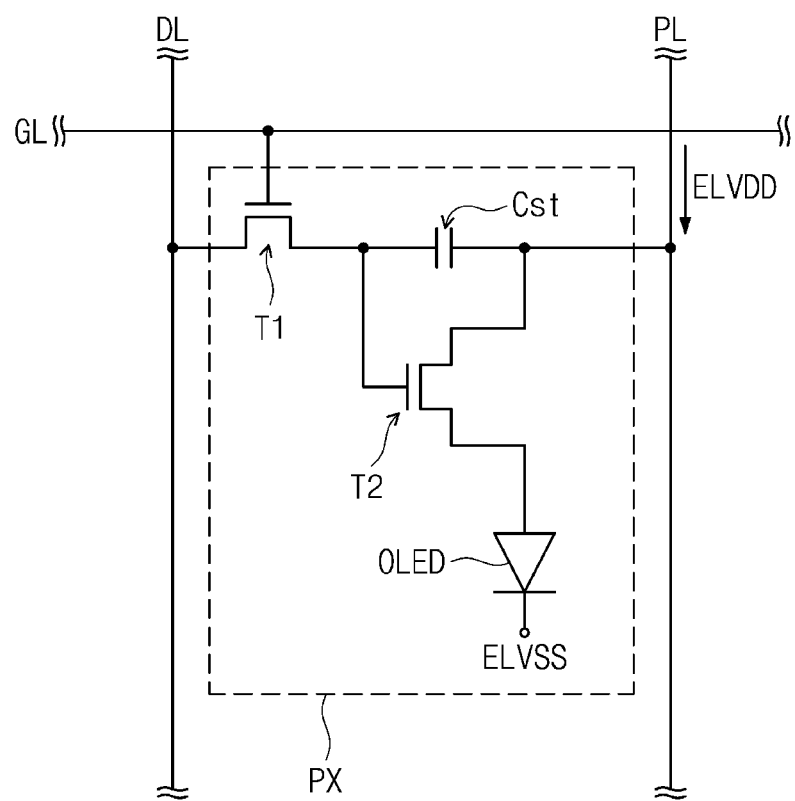
FIG. 3B is an equivalent circuit diagram of the pixel of FIG. 3A according to an exemplary embodiment.
Figure 3C:
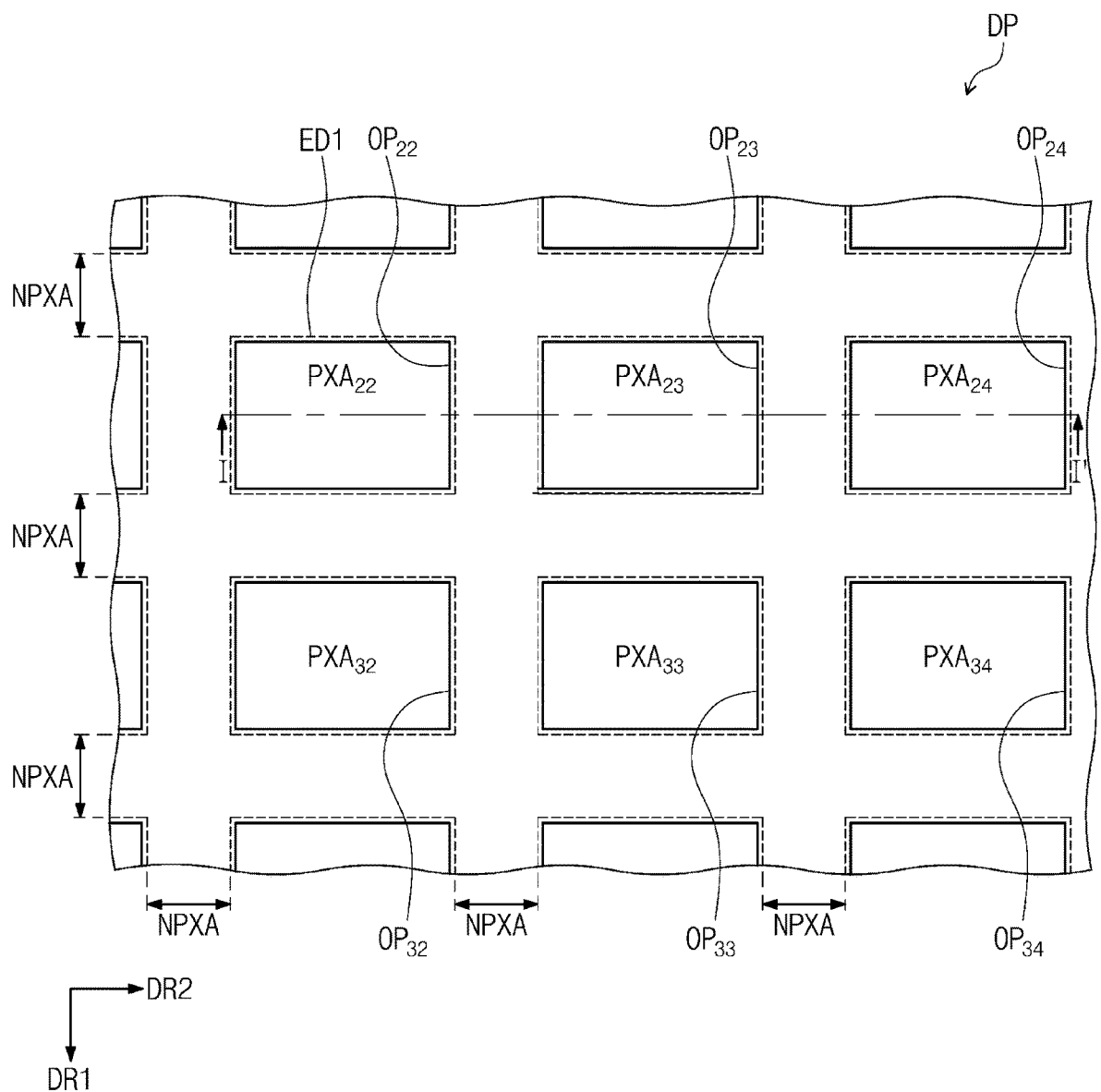
FIG. 3C is a plan view schematically illustrating a portion of a display panel according to an exemplary embodiment.
Figure 4:
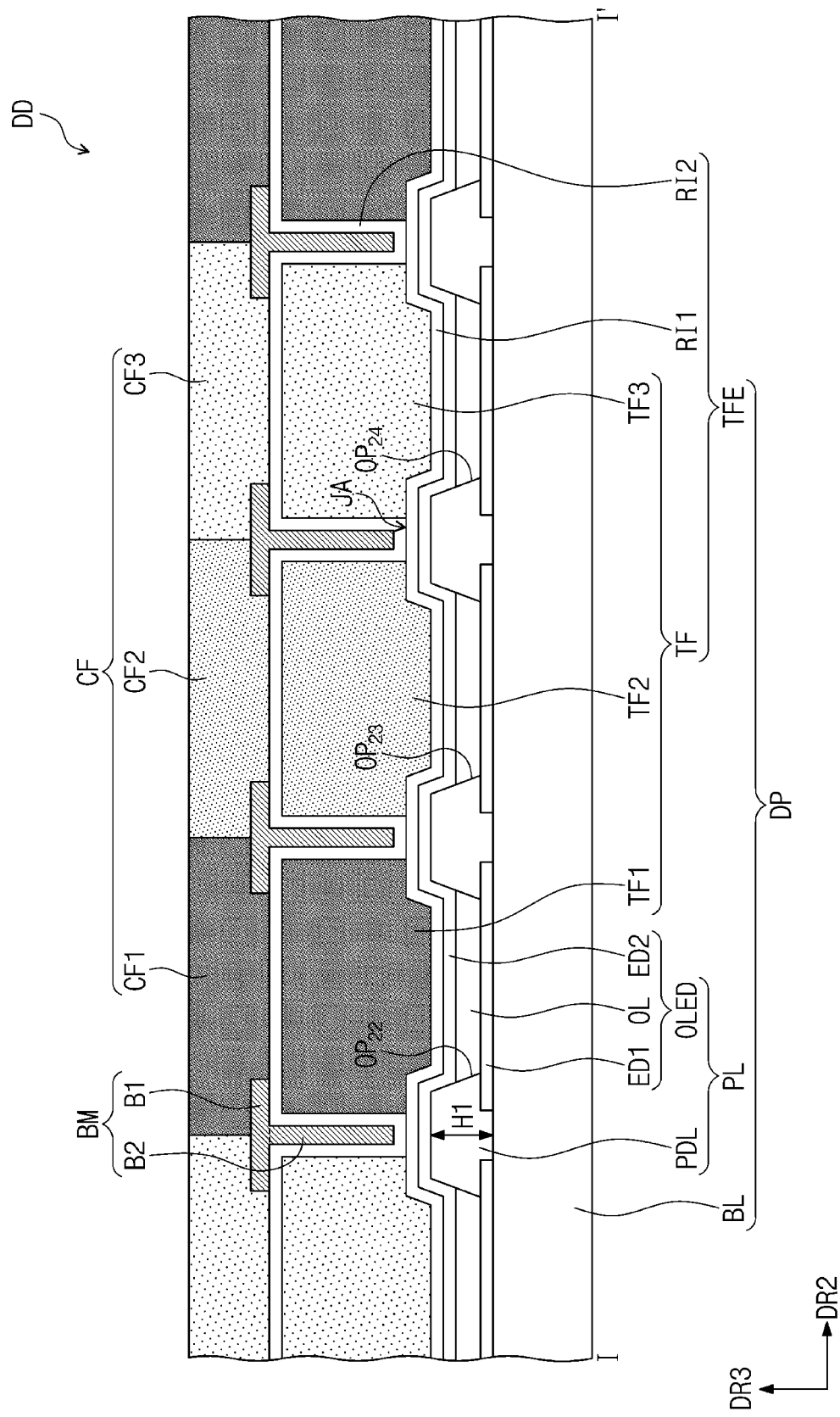
FIG. 4 is a cross-sectional view taken along line I-I' of FIG. 3C.

FIG. 1 is a perspective view of a display device according to an exemplary embodiment. FIG. 2 is a cross-sectional view of a display device according to an exemplary embodiment. FIG. 3A is a block diagram of a display device according to an exemplary embodiment. FIG. 3B is an equivalent circuit diagram of the pixel of FIG. 3A according to an exemplary embodiment. FIG. 3C is a plan view schematically illustrating a portion of a display panel according to an exemplary embodiment. FIG. 4 is a cross-sectional view taken along line I-I' of FIG. 3C. Hereinafter, a display device according to an exemplary embodiment will be described with reference to FIGS. 1 to 4.

Referring to FIG. 1, a display device DD may display an image IM through a display surface DD-IS. The display surface DD-IS may be defined to be substantially parallel to a first direction DR1 and a second direction DR2. Hereinafter, a normal direction of the display surface DD-IS (e.g., a thickness direction of the display device DD) will be referred to as a third direction DR3.

FIG. 1 exemplarily shows the display device DD as a cellphone terminal. The cellphone terminal may further include an electronic module, a camera module, a power module, and so forth, which are mounted on a mainboard and are provided in a bracket or case, along with the display device DD. However, the inventive concepts are not limited thereto, and in some exemplary embodiments, the display device DD may be used for large-sized electronic devices (e.g., television sets and monitors) or small- or medium-sized electronic devices (e.g., tablets, car navigation systems, game machines, and smart watches).

As shown in FIG. 1, an active region DD-DA may have a substantially rectangular or tetragonal shape. A non-active region DD-NDA may enclose or surround the active region DD-DA. However, the inventive concepts are not limited thereto, and in some exemplary embodiments, shapes of the active and non-active regions DD-DA and DD-NDA may be variously changed.

Referring to FIGS. 2 to 3C, the display device DD may include a base layer BL, a device layer PL, an encapsulation member TFE, a color filter member CF, and a window layer WL.

The base layer BL may be an underlying layer, on which other elements of the display panel DP may be provided. The base layer BL may include a plurality of thin films sequentially stacked one over another. For example, the base layer BL may include an organic layer and/or an inorganic layer. The plurality of thin films may include a plurality of thin film transistors and a capacitor to be described below.

In an exemplary embodiment, the base layer BL may be formed by forming a synthetic resin layer on a working substrate, which is used to fabricate the display panel DP, forming conductive and insulating layers on the synthetic resin layer, and then removing the working substrate such that the synthetic resin layer may function as the base layer BL. In an exemplary embodiment, the synthetic resin layer may be a flexible polyimide resin layer. In some exemplary embodiments, the base layer BL may include a rigid glass substrate, a metal substrate, or a substrate made of an organic/inorganic composite material, but the inventive concepts are not limited thereto.

The device layer PL may be disposed on the base layer BL. The device layer PL may be electrically connected to the base layer BL. The device layer PL may include a plurality of pixels emitting light, and the light emitting operation of the pixels may be controlled by an electric field.

The encapsulation member TFE may be disposed on the device layer PL. The encapsulation member TFE may cover the device layer PL and protect the device layer PL from external moisture and oxygen. The encapsulation member TFE may be provided in the form of a thin film including a plurality of inorganic layers and at least one organic layer.

The color filter member CF may be disposed on the device layer PL. The color filter member CF may include a plurality of patterns having different colors. The color filter member CF may improve color reproduction characteristics of light provided from the device layer PL.

The window layer WL may be disposed on the color filter member CF. The window layer WL may cover substantially the entire top surface of the device layer PL, when viewed in a plan view. The window layer WL may be formed of or include a material with high transmittance. The window layer WL may allow a user to easily recognize light, which is emitted from the device layer PL, and may protect the device layer PL from an external impact.

Referring to FIG. 3A, the display panel DP may include a timing control unit TC, a gate driving unit SD, a data driving unit DG, and a pixel region PXP. However, the inventive concepts are not limited thereto, and in some exemplary embodiments, at least one of the timing control unit TC, the gate driving unit SD, the data driving unit DG may be provided as an additional element, regardless of the display panel DP.

The display panel DP may include the base layer BL, a pixel layer CL, and the encapsulation member TFE. The timing control unit TC, the gate driving unit SD, the data driving unit DG, and the pixel region PXP may be formed in the pixel layer CL.

The timing control unit TC may receive input image signals and may output image data $I_{DATA}$, which are converted according to an operation mode of the display panel DP, and a variety of control signals SCS and DCS.

The gate driving unit SD may receive a gate driving control signal SCS from the timing control unit TC. The gate driving unit SD supplied with the gate driving control signal SCS may generate a plurality of gate signals. The gate signals may be sequentially supplied to the display panel DP.

The data driving unit DG may receive the data driving control signal DCS and the converted image data $I_{DATA}$ from the timing control unit TC. The data driving unit DG may generate a plurality of data signals, based on the data driving control signal DCS and the converted image data $I_{DATA}$. The data signals may be supplied to the display panel DP.

The display panel DP may be applied with an external electrical signal and display an image. The display panel DP may include a plurality of gate lines SL1-SLn, a plurality of data lines DL1-DLm, and a plurality of pixels PX11-PXnm.

The gate lines SL1-SLn may extend in the first direction DR1 and may be arranged in the second direction DR2 crossing the first direction DR1. The gate lines SL1-SLn may be sequentially supplied with the gate signals from the gate driving unit SD.

The data lines DL1-DLm may be provided to cross the gate lines SL1-SLn while being electrically disconnected from the gate lines SL1-SLn. The data lines DL1-DLm may extend in the second direction DR2 and may be arranged in the first direction DR1. The data lines DL1-DLm may receive the data signals from the gate driving unit SD.

The display panel DP may be supplied with a first power voltage ELVDD and a second power voltage ELVSS, which are provided from the outside. Each of the pixels PX11-PXnm may be turned-on in response to a corresponding gate signal. Each of the pixels PX11-PXnm may receive the first power voltage ELVDD and the second power voltage ELVSS, and may generate light in response to a corresponding data signal. The first power voltage ELVDD may be higher than the second power voltage ELVSS.

Each of the pixels PX11-PXnm may be connected to a corresponding one of the gate lines SL1-SLn and a corresponding one of the data lines DL1-DLm.

Each of the pixels PX11-PXnm may receive a gate signal from the corresponding gate line and a data signal from the corresponding data line. Each of the pixels PX11-PXnm may be turned-on in response to a corresponding gate signal. Each of the pixels PX11-PXnm may generate light in accordance to the corresponding data signal to display an image.

Each of the pixels PX11-PXnm may include at least one transistor, at least one capacitor, and an organic light emitting element. FIG. 3B exemplarily illustrates an equivalent circuit diagram of a pixel PX, which is connected to one of the gate lines SL1-SLn and one of the data lines DL1-DLm.

The pixel PX may include a first thin film transistor T1, a second thin film transistor T2, a capacitor Cst, and an organic light emitting element OLED. The first thin film transistor T1 may include an input electrode and an output electrode. The first thin film transistor T1 may output a data signal, which is applied to a corresponding one of the data lines, in response to a scan signal applied to a corresponding one of the gate lines.

The capacitor Cst may include a first capacitor electrode connected to the first thin film transistor T1 and a second capacitor electrode configured to receive the first power voltage ELVDD. The capacitor Cst may store an amount of charges corresponding to a difference between a voltage corresponding to the data signal, which is received from the first thin film transistor T1, and the first power voltage ELVDD.

The second thin film transistor T2 may include a control electrode, which is connected to the output electrode of the first thin film transistor T1 and the first capacitor electrode of the capacitor Cst, an input electrode, which receives the first power voltage ELVDD, and an output electrode. The output electrode of the second thin film transistor T2 may be connected to the organic light emitting element OLED.

The second thin film transistor T2 may control a driving current flowing through the organic light emitting element OLED, depending on the amount of charges stored in the capacitor Cst. A turn-on time of the second thin film transistor T2 may be determined depending on the amount of charges stored in the capacitor Cst. In an exemplary embodiment, the output electrode of the second thin film transistor T2 may supply a voltage, which may be substantially lower than the first power voltage ELVDD, to the organic light emitting element OLED.

The organic light emitting element OLED may include a first electrode connected to the second thin film transistor T2 and a second electrode configured to receive the second power voltage ELVSS. The organic light emitting element OLED may include a light-emitting pattern, which is disposed between the first electrode and the second electrode.

The organic light emitting element OLED may emit light when the second thin film transistor T2 is turned on. Color of light emitted from the organic light emitting element OLED may be determined by a material of the light-emitting pattern. For example, the color of light emitted from the organic light emitting element OLED may be one of red, green, blue, or white. In an exemplary embodiment, the color of light emitted from the organic light emitting element OLED may be blue.

Referring to FIGS. 3C and 4, the base layer BL of the display panel DP may be divided into a plurality of light-emitting regions and a non-light-emitting region adjacent to the light-emitting regions. FIG. 3C illustrates a region including some of the light-emitting regions (e.g., $PXA_{22}$, $PXA_{23}$, $PXA_{24}$, $PXA_{32}$, $PXA_{33}$, and $PXA_{34}$). FIG. 4 illustrates a portion of the light-emitting regions including openings $OP_{22}$, $OP_{23}$, and $OP_{24}$, and the window layer WL of the display device DD is not shown.

The light-emitting regions $PXA_{22}$, $PXA_{23}$, $PXA_{24}$, $PXA_{32}$, $PXA_{33}$, and $PXA_{34}$ may be spaced apart from each other with a non-light-emitting region NPXA interposed therebetween. The light-emitting regions $PXA_{22}$, $PXA_{23}$, $PXA_{24}$, $PXA_{32}$, $PXA_{33}$, and $PXA_{34}$ may be arranged in various shapes.

For example, the light-emitting regions $PXA_{22}$, $PXA_{23}$, $PXA_{24}$, $PXA_{32}$, $PXA_{33}$, and $PXA_{34}$ may be arranged in a matrix shape. Thus, the non-light-emitting region NPXA may have a grid shape. However, the inventive concepts are not limited thereto, and the arrangement shape of the light-emitting regions $PXA_{22}$, $PXA_{23}$, $PXA_{24}$, $PXA_{32}$, $PXA_{33}$, and $PXA_{34}$ may be variously changed.

The device layer PL may be disposed on the base layer BL. The device layer PL may include the organic light emitting element OLED and a pixel definition layer PDL. The organic light emitting element OLED may include a first electrode ED1, a light emitting layer OL, and a second electrode ED2. The pixel definition layer PDL may include a plurality of openings.

Each of the first electrodes ED1 may be disposed to be overlapped with a corresponding one of the light-emitting regions $PXA_{22}$, $PXA_{23}$, $PXA_{24}$, $PXA_{32}$, $PXA_{33}$, and $PXA_{34}$. In an exemplary embodiment, the first electrode ED1 may include a coupling part electrically connected to the second thin film transistor T2 included in the base layer BL.

The first electrode ED1 may be a reflective electrode or a transmissive electrode. When the display device is a top-emission type, the first electrode ED1 may include a reflective metal, such as silver, gold, or platinum. When the display device is a bottom-emission type, the first electrode ED1 may include a transmissive metal, such as transparent conductive oxide (TCO).

The pixel definition layer PDL may be disposed on the first electrode ED1. The pixel definition layer PDL may define the light-emitting regions $PXA_{22}$, $PXA_{23}$, $PXA_{24}$, $PXA_{32}$, $PXA_{33}$, and $PXA_{34}$ and the non-light-emitting region NPXA. FIG. 3C illustrates some of the plurality of openings in the pixel definition layer PDL (e.g., openings $OP_{22}$, $OP_{23}$, $OP_{24}$, $OP_{32}$, $OP_{33}$, and $OP_{34}$) corresponding to the light-emitting regions $PXA_{22}$, $PXA_{23}$, $PXA_{24}$, $PXA_{32}$, $PXA_{33}$, and $PXA_{34}$.

The openings $OP_{22}$, $OP_{23}$, $OP_{24}$, $OP_{32}$, $OP_{33}$, and $OP_{34}$ may substantially define the light-emitting regions $PXA_{22}$, $PXA_{23}$, $PXA_{24}$, $PXA_{32}$, $PXA_{33}$, and $PXA_{34}$ and the non-light-emitting region NPXA. Regions overlapping the openings $OP_{22}$, $OP_{23}$, $OP_{24}$, $OP_{32}$, $OP_{33}$, and $OP_{34}$ may be defined as the light-emitting regions $PXA_{22}$, $PXA_{23}$, $PXA_{24}$, $PXA_{32}$, $PXA_{33}$, and $PXA_{34}$, and a region not overlapping the openings $OP_{22}$, $OP_{23}$, $OP_{24}$, $OP_{32}$, $OP_{33}$, and $OP_{34}$ may be defined as the non-light-emitting region NPXA.

Each of the openings $OP_{22}$, $OP_{23}$, $OP_{24}$, $OP_{32}$, $OP_{33}$, and $OP_{34}$ may expose a corresponding one of the first electrodes ED1. A light emitting layer OL to be described below may be disposed on the first electrode ED1 exposed by the openings $OP_{22}$, $OP_{23}$, $OP_{24}$, $OP_{32}$, $OP_{33}$, and $OP_{34}$.

The pixel definition layer PDL may be overlapped with the non-light-emitting region NPXA, and may expose regions of the first electrode ED1, which are overlapped with the light-emitting regions $PXA_{22}$, $PXA_{23}$, $PXA_{24}$, $PXA_{32}$, $PXA_{33}$, and $PXA_{34}$.

The light emitting layer OL and the second electrode ED2 may be sequentially disposed on the first electrode ED1. Each of the light emitting layer OL may be disposed to be overlapped with a corresponding one of the light-emitting regions $PXA_{22}$, $PXA_{23}$, $PXA_{24}$, $PXA_{32}$, $PXA_{33}$, and $PXA_{34}$. The light emitting layer OL may be formed of or include an organic material. However, the inventive concepts are not limited to a specific material of the organic material.

For example, each of the light emitting layer OL may be formed of at least one of light emitting materials emitting red, green, or blue lights, and may include at least one of fluorescent and phosphorescent materials. In some exemplary embodiments, the light emitting layer OL can be provided in plural. The light emitting layers may be disposed in corresponding light emitting regions to generate light of different colors. The light emitting layer OL may have a single-layered structure, which is formed of a single material or of a plurality of different materials, or a multi-layered structure including a plurality of layers, which are formed of a plurality of different materials. As such, each of the light emitting layer OL may generate light having one of red, green, and blue color, or a mixed color from red, green, and blue. Hereinafter, the light emitting layer OL will be described as generating blue light according to an exemplary embodiment.

The second electrode ED2 may be disposed on the pixel definition layer PDL and the first electrode ED1. The second electrode ED2 may cover the pixel definition layer PDL and the first electrode ED1. The second electrode ED2 may face the first electrode ED1. For example, when the first electrode ED1 is an anode, the second electrode ED2 may be a cathode. The second electrode ED2 may be formed of a material having a low work function to facilitate an electron injection.

The second electrode ED2 may be formed of or include a conductive material. The conductive material may be metals, alloys, electrically conductive compounds, and mixtures thereof. For example, the second electrode ED2 may include at least one of reflective materials including lithium (Li), magnesium (Mg), aluminum (Al), aluminum-lithium (Al—Li), calcium (Ca), magnesium-indium (Mg—In), and magnesium-silver (Mg—Ag). Alternatively, the second electrode layer ED2 may include at least one of transmissive materials including indium tin oxide, indium zinc oxide, zinc oxide, and indium tin zinc oxide.

The second electrode ED2 may have a single- or multi-layered structure. When the second electrode ED2 has the multi-layered structure, the second electrode ED2 may include at least one of a layer made of the reflective material and a layer made of the transmissive material. The second electrode ED2 may be a reflective, transflective, or transmissive electrode. However, the inventive concepts are not limited thereto, and the material of the second electrode ED2 may be variously changed, depending on the structure of the organic light emitting element.

The organic light emitting element OLED may include a hole transport region and an electron transport region. The hole transport region may be disposed between the first electrode ED1 and the light emitting layer OL. The hole transport region may include at least one of a hole injection layer, a hole transport layer, and a single layer having both of a hole injection function and a hole transport function. The hole transport region may be formed of at least one of a hole injection material or a hole transport material. Each of the hole injection material and the hole transport material may include materials known in the art.

The electron transport region may be disposed between the light emitting layer OL and the second electrode ED2. The electron transport region may be disposed on a path of an electron moving toward the light emitting layer OL. The electron transport region may be formed of or include at least one of an electron transport material or an electron injection material. The electron transport region may be an electron transport layer including an electron transport material or a single electron injection/transport layer including an electron transport material and an electron injection material.

The encapsulation member TFE may be disposed on the device layer PL. The encapsulation member TFE may include a first inorganic layer RI1, a second inorganic layer RI2, and an organic pattern TF. The organic pattern TF may include a plurality of color conversion patterns TF1, TF2, and TF3.

The first inorganic layer RI1 may be disposed on the second electrode ED2. The first inorganic layer RI1 and the second inorganic layer RI2 may be encapsulate the organic pattern TF. The second inorganic layer RI2 may be disposed on the organic pattern TF to cover the organic pattern TF. The first inorganic layer RI1 may cover the second electrode ED2. Each of the first inorganic layer RI1 and the second inorganic layer RI2 may be formed of or include at least one of aluminum oxide, silicon oxide, silicon nitride, silicon oxynitride, silicon carbide, titanium oxide, zirconium oxide, and zinc oxide. The first inorganic layer RI1 and the second inorganic layer RI2 may include the same material or may include materials different from each other.

The second inorganic layer RI2 will be described with reference to the following table 1.

TABLE 1

|  | Comparative Example | Embodiment 1 | Embodiment 2 |
| --- | --- | --- | --- |
| Optical Efficiency (%) | 4.5% | 10.3% | 9.9% |

The Table 1 shows a difference in optical efficiency from the presence of the second inorganic layer RI2 disposed on the organic pattern TF. In the comparative example, the second inorganic layer was not disposed on the organic pattern TF. In the embodiment 1, a second inorganic layer including silicon nitride ($SiN_x$) was disposed on the organic pattern TF, and in the embodiment 2, a second inorganic layer including silicon oxide ($SiO_x$) was disposed on the organic pattern TF. In the comparative example, the optical efficiency of light generated from the organic light emitting element was 4.5%, whereas the optical efficiencies in the embodiments 1 and 2 were 10.3% and 9.9%, respectively, which were higher than that of the comparative example. Since the display device DD according to an exemplary embodiment include the second inorganic layer RI2 disposed on the organic pattern TF, the display device DD may have an improved optical efficiency. The organic pattern TF may include a first color conversion pattern TF1, a second color conversion pattern TF2, and a light transmitting pattern TF3. Each of the first color conversion pattern TF1, the second color conversion pattern TF2, and the light transmitting pattern TF3 may be overlapped with a corresponding one of the openings.

FIG. 4 exemplarily illustrates the first color conversion pattern TF1, the second color conversion pattern TF2, the light transmitting pattern TF3, which are respectively overlapped with some of the openings (e.g., $OP_{22}$, $OP_{23}$, and $OP_{24}$). For example, the first color conversion pattern TF1 may be disposed to be overlapped with the first opening $OP_{22}$. The second color conversion pattern TF2 may be disposed to be overlapped with the second opening $OP_{23}$, and the light transmitting pattern TF3 may be disposed to be overlapped with the third opening $OP_{24}$.

In an exemplary embodiment, the organic pattern TF may be disposed between the first inorganic layer RI1 and the second inorganic layer RI2. The first color conversion pattern TF1, the second color conversion pattern TF2, and the light transmitting pattern TF3 may be disposed on the same layer and be spaced apart from each other.

The first inorganic layer RI1 and the second inorganic layer RI2 may be in contact with each other, in a gap region between the first color conversion pattern TF1, the second color conversion pattern TF2, and the light transmitting pattern TF3. The second inorganic layer RI2 may cover the organic pattern TF, and may delimit each of the first color conversion pattern TF1, the second color conversion pattern TF2, and the light transmitting pattern TF3. Since the first color conversion pattern TF1, the second color conversion pattern TF2, and the light transmitting pattern TF3 are spaced apart from each other, a color mixing between the patterns may be prevented or suppressed.

In an exemplary embodiment, the light transmitting pattern TF3 may display substantially the same color of light as that provided from the organic light emitting element OLED. For example, a blue light emitted from the organic light emitting element OLED may pass through the light transmitting pattern TF3, without a substantial change in color or wavelength. The light transmitting pattern TF3, which corresponds to a blue light emitting region, may be formed of or include a material that may transmit blue light incident thereto without including phosphors or quantum dots. The light transmitting pattern TF3 may further include scattering bodies. In an exemplary embodiment, the light transmitting pattern TF3 may be formed of or include at least one of titanium oxide ($TiO_2$), a polymer (e.g., photo-sensitive resin), blue dye, or blue pigment. However, the inventive concepts are not limited thereto as long as a material of the light transmitting pattern TF3 may scatter blue light, without changing the color.

When the first color conversion pattern TF1 and the second color conversion pattern TF2 include a plurality of light-converting quantum dots, the quantum dots may be selected from the group consisting of II-VI compounds, III-V compounds, IV-VI compounds, IV elements, IV compounds, and combination thereof. The II-VI compounds may be selected from the group consisting of binary compounds (e.g., CdSe, CdTe, ZnS, ZnSe, ZnTe, ZnO, HgS, HgSe, HgTe, MgSe, and MgS), mixtures of the binary compounds, ternary compounds (e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds. The III-V compounds may be selected from the group consisting of binary compounds (e.g., GaN, GaP, GaAs, GaSb, AlN, AlP, AlAs, AlSb, InN, InP, InAs, and InSb), mixtures of the binary compounds, ternary compounds (e.g., GaNP, GaNAs, GaNSb, GaPAs, GaPSb, AlNP, AlNAs, AlNSb, AlPAs, AlPSb, InNP, InNAs, InNSb, InPAs, InPSb, and GaAlNP), mixtures of the ternary compounds, quaternary compounds (e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds. The IV-VI compounds may be selected from the group consisting of binary compounds (e.g., SnS, SnSe, SnTe, PbS, PbSe, and PbTe), mixtures of the binary compounds, ternary compounds (e.g., SnSeS, SnSeTe, SnSTe, PbSeS, PbSeTe, PbSTe, SnPbS, SnPbSe, and SnPbTe), mixtures of the ternary compounds, quaternary compounds (e.g., SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof. The shapes of the quantum dots may be variously changed, and the inventive concepts are not limited to a particular shape of the quantum dots. For example, the quantum dots may be spherical, pyramid-shaped, multi-arm, or cubic nano particles and in an exemplary embodiment, a nano tube, a nano wire, a nano fiber, or a nano plate-shaped particle may also be used for each of the quantum dots. In addition, the first color conversion pattern TF1 and the second color conversion pattern TF2 may include a plurality of phosphors. For example, the first color conversion pattern TF1 may include phosphors that absorb blue light emitted from the organic light emitting element OLED and emit red light. For example, the red light phosphors may be at least one of (Ca, Sr, Ba)S, (Ca, Sr, Ba)$_2Si_5N_8$, CASN (CaAlSiN$_3$), CaMoO4, and Eu$_2Si_5N_8$. The second color conversion pattern TF2 may include phosphors that may absorb blue light emitted from the organic light emitting element OLED and emit green light. For example, the green light phosphors may be at least one of yttrium aluminum garnet (YAG), (Ca, Sr, Ba)$_2SiO_4$, SrGa$_2S_4$, BAM, α-SiAlON, β-SiAlON, Ca$_3Sc_2Si_3O_{12}$, Tb$_3Al_5O_{12}$, BaSiO$_4$, CaAlSiON, and (Sr$_{1-x}$Ba$_x$)Si$_2O_2N_2$.

In an exemplary embodiment, the display device DD may include a light-blocking pattern BM. The light-blocking pattern BM may be overlapped with the pixel definition layer PDL. The light-blocking pattern BM may include a first portion B1 and a second portion B2. The first portion B1 and the second portion B2 may be a main structure substantially forming the light-blocking pattern BM.

The first portion B1 may extend along the second inorganic layer RI2. The first portion B1 extended onto the second inorganic layer RI2 may be covered with the color filter member CF. The second portion B2 may be covered with the second inorganic layer RI2. The second portion B2 may be disposed in a gap region between the color conversion patterns TF1, TF2, and TF3. In particular, the second portion B2 may be covered with the second inorganic layer RI2 covering side surfaces of adjacent color patterns.

The light-blocking pattern BM may include at least one of optically opaque materials (e.g., metal particles of chromium (Cr), silver (Ag), molybdenum (Mo), nickel (Ni), titanium (Ti), tantalum (Ta), oxides of the metal particles, or organic material). The light-blocking pattern BM may be disposed in a gap region between the color conversion patterns TF1, TF2, and TF3, and prevent or suppress a color mixing between the color conversion patterns TF1, TF2, and TF3. In this manner, a light leakage phenomenon may be prevented or suppressed from occurring in the display device DD, and a contrast property of the display device DD may be improved.

The color filter member CF may improve color reproduction characteristics of light provided from the device layer PL. The color filter member CF may be disposed on the encapsulation member TFE. The color filter member CF may include a first color filter pattern CF1, a second color filter pattern CF2, and a third color filter pattern CF3.

The first color filter pattern CF1, the second color filter pattern CF2, and the third color filter pattern CF3 may be disposed to be overlapped with the first color conversion pattern TF1, the second color conversion pattern TF2, and the light transmitting pattern TF3, respectively. Each of the first color filter pattern CF1, the second color filter pattern CF2, and the third color filter pattern CF3 may have substantially the same color as that of light emitted from the overlapping color conversion pattern. Each of the first color filter pattern CF1, the second color filter pattern CF2, and the third color filter pattern CF3 may include pigment or dye.

The first color filter pattern CF1 may emit light having a color substantially the same as that of the first color conversion pattern TF1. For example, the first color filter pattern CF1 may have red color. The second color filter pattern CF2 may emit light having a color substantially the same as that of the second color conversion pattern TF2. For example, the second color filter pattern CF2 may have green color. The third color filter pattern CF3 may emit is having a color substantially the same as that of the light transmitting pattern TF3. For example, the third color filter pattern CF3 may have blue color. Thus, each of the first color conversion pattern TF1, the second color conversion pattern TF2, and the light transmitting pattern TF3 may emit light having a color substantially the same as that of the overlapping first to third color filter patterns CF1, CF2, and CF3, respectively.

In an exemplary embodiment, each of the first color filter pattern CF1, the second color filter pattern CF2, and the third color filter pattern CF3 may include substantially the same material as a corresponding overlapped one of the first color conversion pattern TF1, the second color conversion pattern TF2, and the light transmitting pattern TF3. In some exemplary embodiments, each of the first color filter pattern CF1, the second color filter pattern CF2, and the third color filter pattern CF3 may include a light conversion material (e.g., phosphors or quantum dots) that may change color or wavelength of an incident light.

Figure 5:
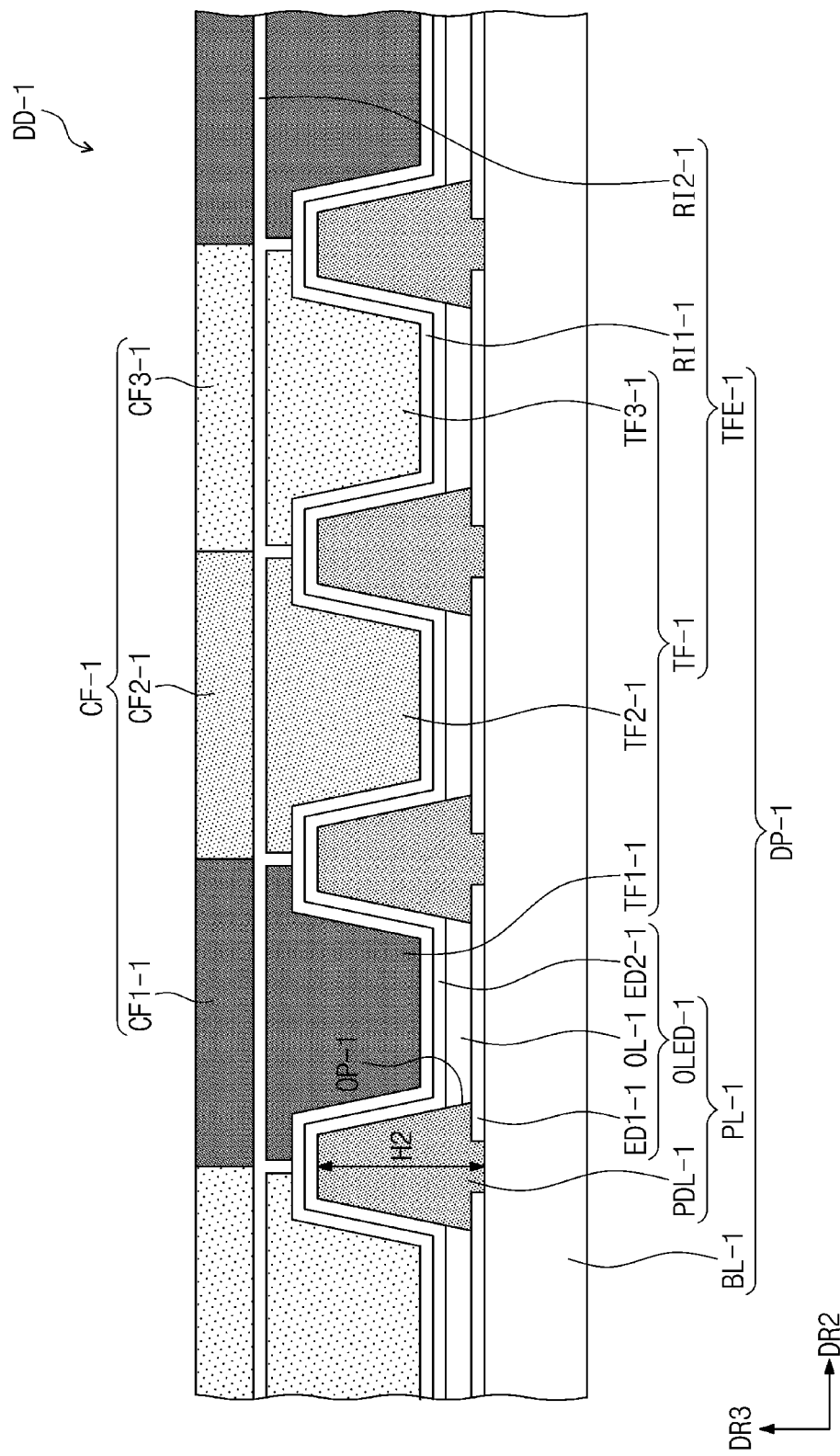
FIG. 5 is a cross-sectional view of a portion of a display device according to an exemplary embodiment.
Figure 6:
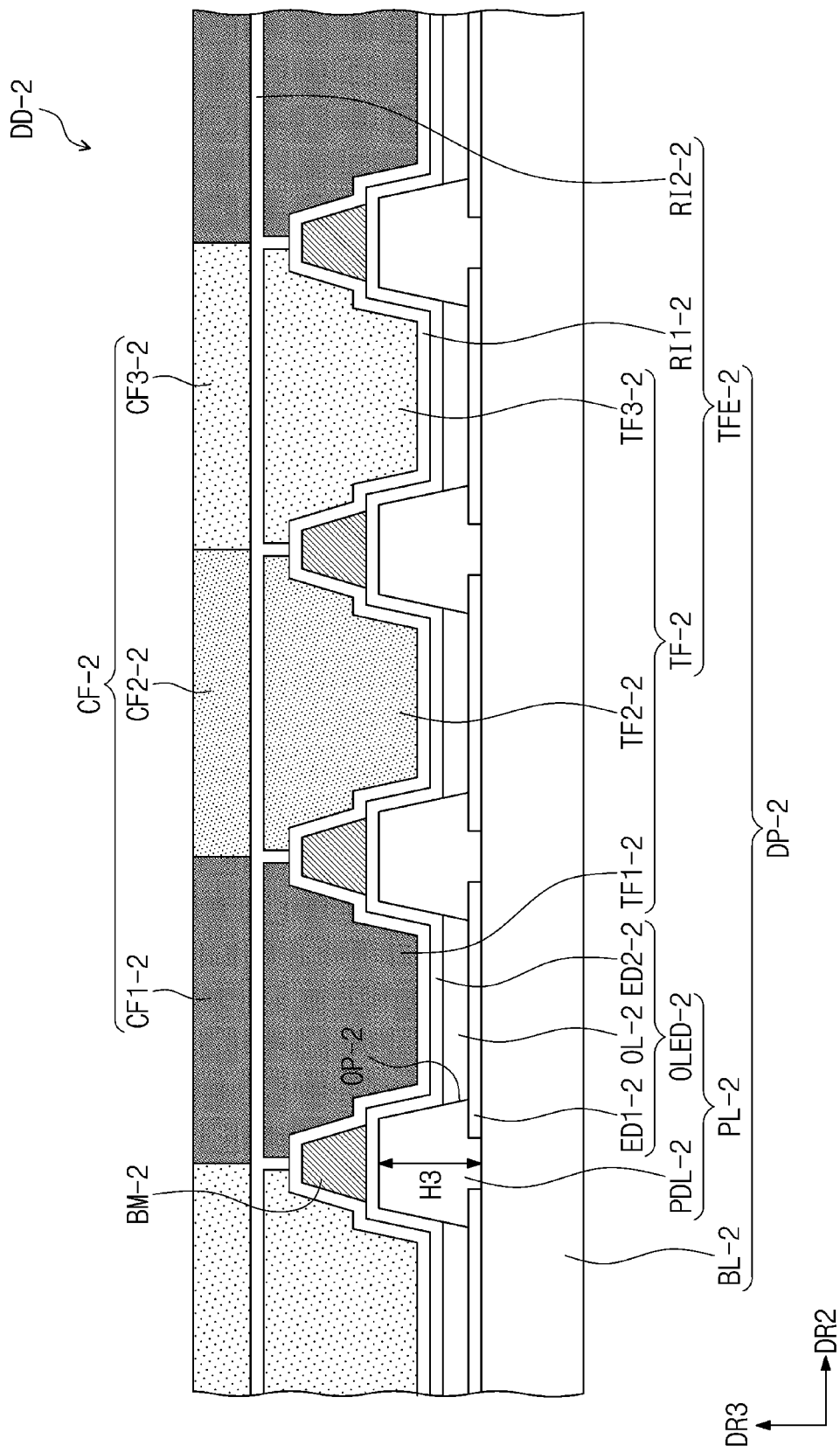
FIG. 6 is a cross-sectional view of a portion of a display device according to an exemplary embodiment.
Figure 7:
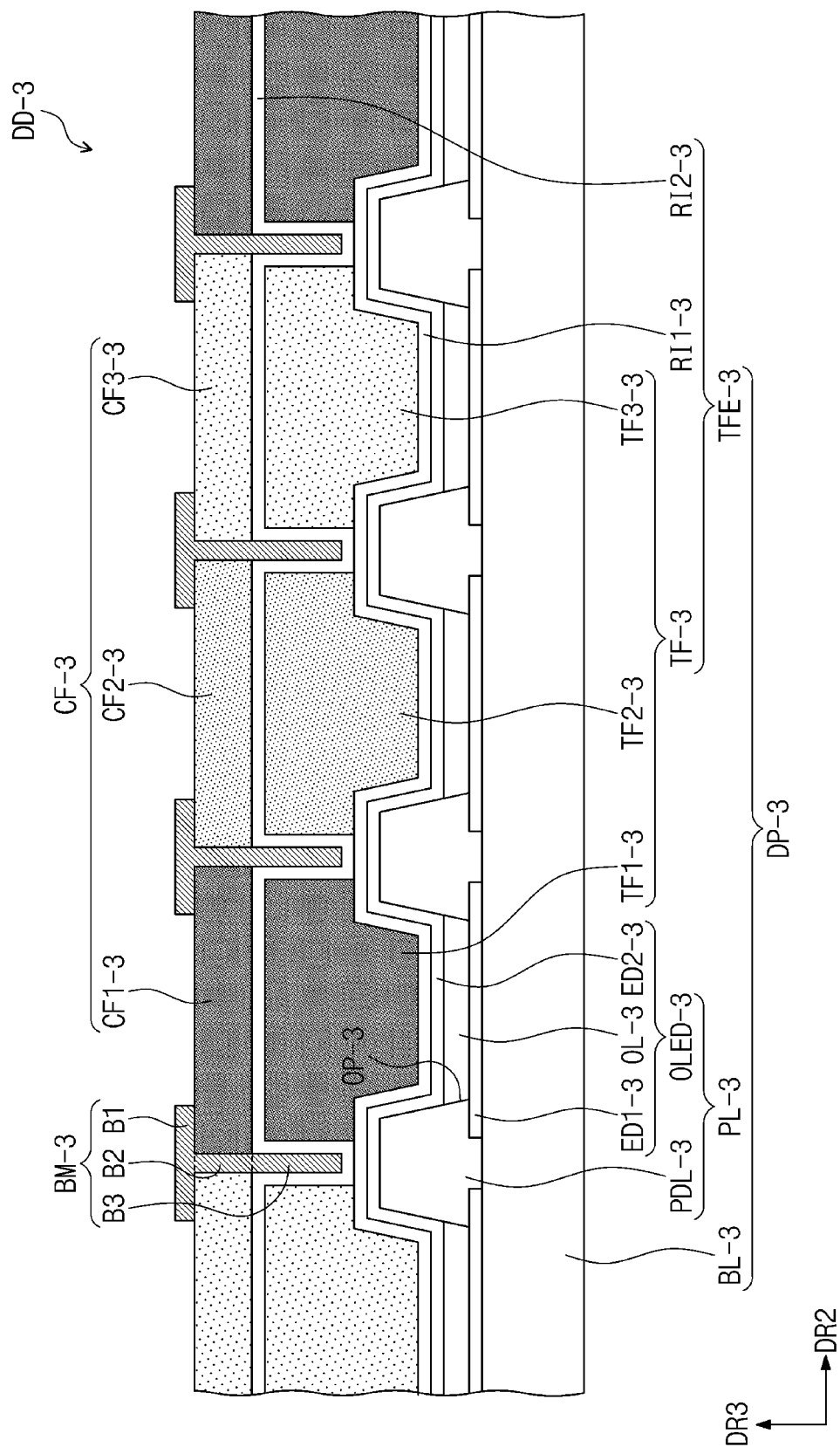
FIG. 7 is a cross-sectional view of a portion of a display device according to an exemplary embodiment.

FIGS. 5 to 7 are cross-sectional views each illustrating a portion of a display device according to exemplary embodiments. The display devices shown in FIGS. 5 to 7 include substantially the same elements as the display device shown in FIGS. 1 to 4, and thus, repeated descriptions of the substantially the same elements will be omitted to avoid redundancy.

Referring to FIG. 5, a display device DD-1 may include a display panel DP-1. The display panel DP-1 may include a base layer BL-1, a device layer PL-1, an encapsulation member TFE-1, and a color filter member CF-1. The device layer PL-1 may include an organic light emitting element OLED-1 and a pixel definition layer PDL-1. The organic light emitting element OLED-1 may include first and second electrodes ED1-1 and ED2-1, and a light emitting layer OL-1. The encapsulation member TFE-1 may include first and second inorganic layers RI1-1 and RI2-1, and an organic pattern TF-1.

The light-blocking pattern BM of the display device DD of FIG. 4 may be omitted from the display device DD-1. In an exemplary embodiment, the pixel definition layer PDL-1 may include a light blocking material. Since the pixel definition layer PDL-1 includes a light blocking material, the pixel definition layer PDL-1 may prevent or suppress a color mixing issue between a first color conversion pattern TF1-1, a second color conversion pattern TF2-1, and a light transmitting pattern TF3-1. As such, the pixel definition layer PDL-1 may provide substantially the same function as the light-blocking pattern BM of FIG. 4. The inventive concepts are not limited to a particular light blocking material in the pixel definition layer PDL-1, and in some exemplary embodiments, any material having a light blocking property may be used to form the pixel definition layer PDL-1.

The pixel definition layer PDL-1 may be covered with a first inorganic layer RI-1. A portion of the pixel definition layer PDL-1 may cover a portion of the first electrode ED-1 exposed by the light emitting layer OL-1.

In an exemplary embodiment, a thickness H2 of the pixel definition layer PDL-1 may be relatively greater than a thickness H1 of the pixel definition layer PDL of FIG. 4. For example, the thickness H2 of the pixel definition layer PDL-1 in the third direction DR3 may be in a range of about 3 μm to about 10 μm. In the illustrated exemplary embodiment, the first color conversion pattern TF1-1, the second color conversion pattern TF2-1, and the light transmitting pattern TF3-1 may be formed in the openings OP-1, respectively, using the pixel definition layer PDL-1 as a partition wall. As such, a mixing or color-mixing issue may be prevented or suppressed between adjacent color conversion patterns.

When the thickness H2 of the pixel definition layer PDL-1 is less than about 3 μm, a color mixing issue may occur between the first color conversion pattern TF1-1, the second color conversion pattern TF2-1, and the light transmitting pattern TF3-1. When the thickness H2 of the pixel definition layer PDL-1 is greater than about 10 μm, a distance between the organic light emitting element OLED-1 and the color filter member CF-1 may be too large and deteriorate color reproduction characteristics.

Referring to FIG. 6, a display device DD-2 may include a display panel DP-2. The display panel DP-2 may include a base layer BL-2, a device layer PL-2, an encapsulation member TFE-2, and a color filter member CF-2. The device layer PL-2 may include an organic light emitting element OLED-2 and a pixel definition layer PDL-2. The organic light emitting element OLED-2 may include first and second electrodes ED1-2 and ED2-2, and a light emitting layer OL-2. The encapsulation member TFE-2 may include first and second inorganic layers RI1-2 and RI2-2, and an organic pattern TF-2.

In the display device DD-2, a light-blocking pattern BM-2 may be disposed between the second electrode ED2-2 and the first inorganic layer RI1-2. In particular, the light-blocking pattern BM-2 may be in contact with a portion of the second electrode ED2-2 overlapped with a top surface of the pixel definition layer PDL-2. The first inorganic layer RI1-2 may cover the second electrode ED2-2 and the light-blocking pattern BM-2 disposed on the second electrode ED2-2. In an exemplary embodiment, the pixel definition layer PDL-2 may include a light blocking material, but the inventive concepts are not limited thereto. In an exemplary embodiment, a thickness H3 of the pixel definition layer PDL-2 may be relatively greater than a thickness H1 of the pixel definition layer PDL of FIG. 4, but relatively less than the thickness H2 of the pixel definition layer PLD-1 of FIG. 5.

Referring to FIG. 7, in a display device DD-3 according to an embodiment, a light-blocking pattern BM-3 may be disposed on a color filter member CF-3. For example, the first portion B1 may be extended onto top surfaces of adjacent color filter patterns to cover a portion of each of the color filter patterns. The second portion B2 may be disposed between side surfaces of the adjacent color filter patterns. A third portion B3 may be disposed in a gap region between a first color conversion pattern TF1-3, a second color conversion pattern TF2-3, and a light transmitting pattern TF3-3. In particular, the third portion B3 may be covered with a second inorganic layer RI2-3, which covers the side surface of the adjacent color filter patterns. The first portion B1, the second portion B2, and the third portion B3 may be connected to form a substantial main structure of the light-blocking pattern BM-3. In an exemplary embodiment, a pixel definition layer PDL-3 may include a light blocking material, but the inventive concepts are not limited thereto.

FIGS. 8A to 8I are cross-sectional views illustrating a method of fabricating a display device according to an exemplary embodiment. In the illustrated exemplary embodiment, the method of fabrication will be described with reference to the display device shown in FIG. 4, and repeated descriptions of the elements forming the display device will be omitted to avoid redundancy.

Referring to FIG. 8A, the first electrode ED1 may be formed on the base layer BL of a preliminary display panel DPA. In an exemplary embodiment, a plurality of the first electrodes ED1 may be simultaneously formed by a single patterning process. For example, forming the first electrodes ED1 may include coating an entire top surface of the base layer BL with a conductive material to form a conductive layer, and patterning the conductive layer through a photolithography process to form a plurality of the first electrodes ED1. Alternatively, forming the first electrode ED1 may include depositing a conductive material on the base layer BL using a depositing mask. The base layer BL may be formed by sequentially stacking a plurality of thin films. For example, the base layer BL may be formed by depositing an organic layer and/or an inorganic layer. A plurality of thin film transistors and a capacitor may be formed in the thin films or as parts of the thin films.

Referring to FIG. 8B, the pixel definition layer PDL may be formed on the base layer BL. Forming the pixel definition layer PDL may include forming an underlying layer including an insulating material on the base layer BL, and patterning the underlying layer using a photolithography process or the like. In the patterning process, a plurality of openings $OP_{22}$, $OP_{23}$, and $OP_{24}$ may be defined in the underlying layer to form the pixel definition layer PDL with the openings $OP_{22}$, $OP_{23}$, and $OP_{24}$ therein. Each of the openings $OP_{22}$, $OP_{23}$, and $OP_{24}$ may be overlapped with the first electrode ED1.

Figure 8C:
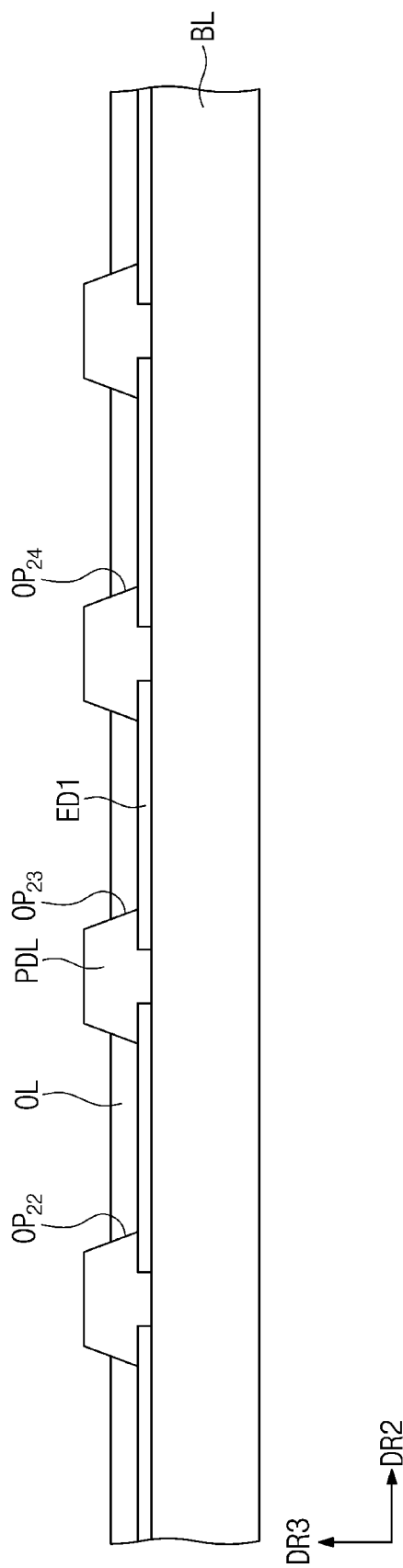
Figure 8D:
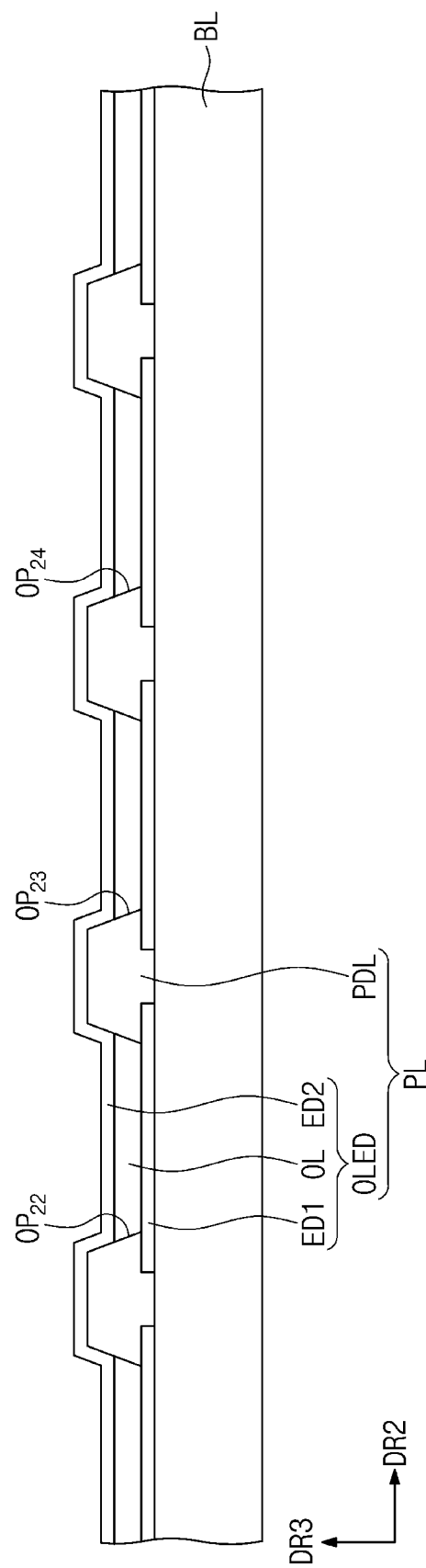

Referring to FIGS. 8C and 8D, the light emitting layer OL and the second electrode ED2 may be sequentially formed on the first electrode ED1. The light emitting layer OL may be formed to be overlapped with a corresponding one of the openings $OP_{22}$, $OP_{23}$, and $OP_{24}$. The light emitting layer OL may be formed by depositing an organic material on the openings $OP_{22}$, $OP_{23}$, and $OP_{24}$ using a mask. The light emitting layer OL may be formed by various methods, such as a vacuum deposition method, a spin coating method, a cast method, a Langmuir-Blodgett (LB) method, an inkjet printing method, a laser printing method, and a laser-induced thermal imaging (LITI) method, without being limited thereto.

Referring to FIG. 8D, the second electrode ED2 may be formed on the light emitting layer OL. The second electrode ED2 may be formed by coating a conductive material to cover substantially the entire top surfaces of the pixel definition layer PDL and the light emitting layer OL.

Figure 8E:
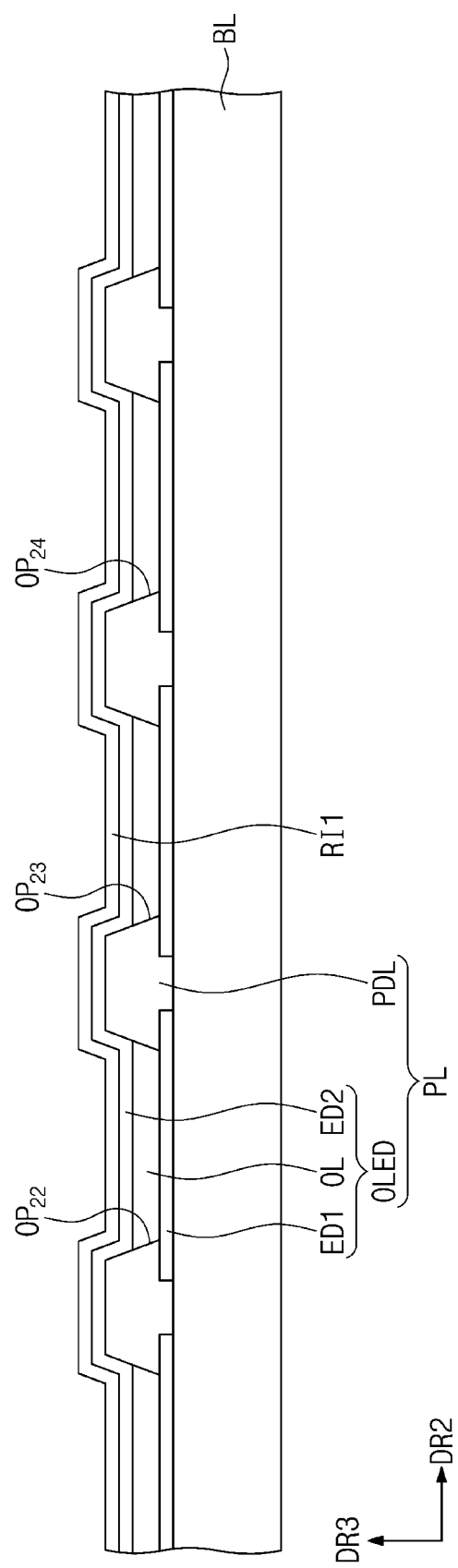

Referring to FIG. 8E, the first inorganic layer RI1 may be formed on the second electrode ED2. The first inorganic layer RI1 may be formed by depositing at least one of aluminum oxide, silicon oxide, silicon nitride, silicon oxynitride, silicon carbide, titanium oxide, zirconium oxide, and zinc oxide on the second electrode ED2. For example, the deposition process may include a chemical vapor deposition.

Figure 8F:
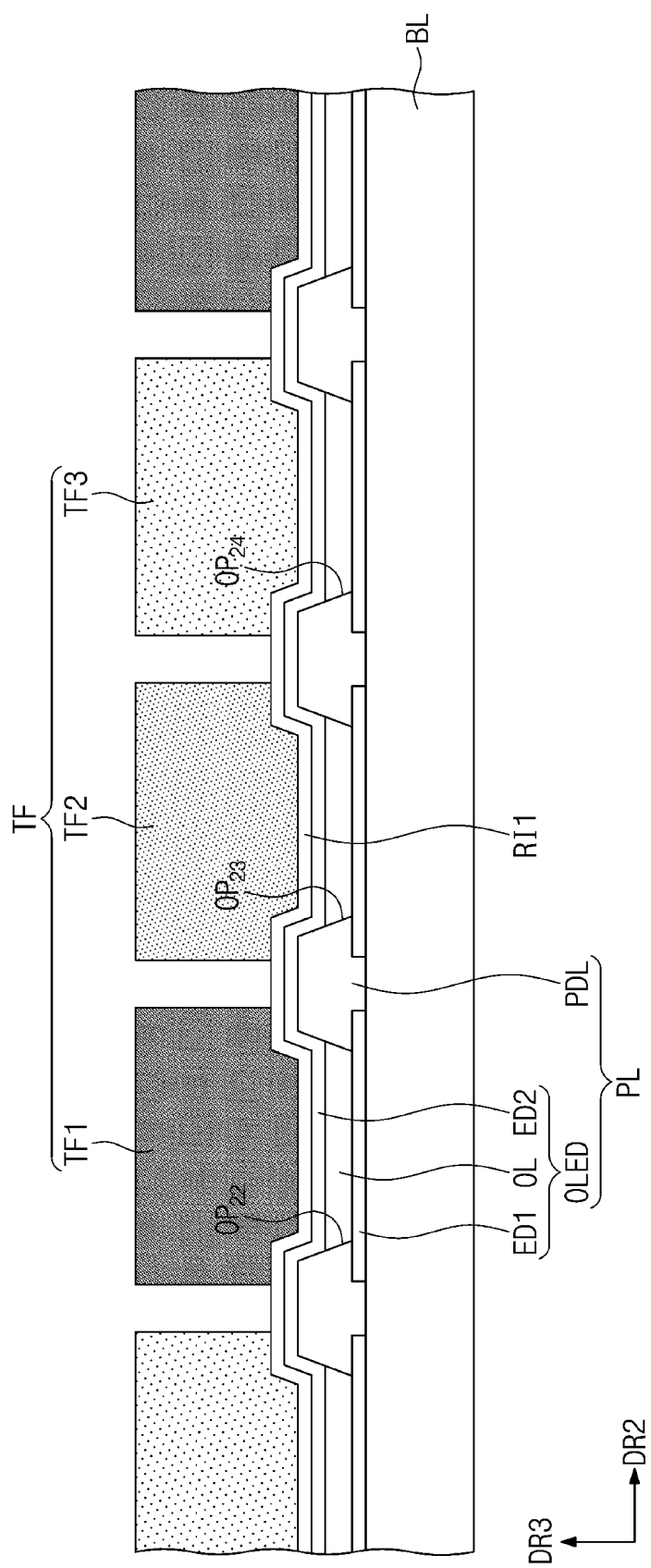

Referring to FIG. 8F, the first color conversion pattern TF1, the second color conversion pattern TF2, and the light transmitting pattern TF3 may be sequentially formed on the first inorganic layer RI1. The organic pattern TF may include a material including a quantum dot, and may be formed through a coating and patterning process or an inkjet process. Each of the first color conversion pattern TF1, the second color conversion pattern TF2, and the light transmitting pattern TF3 may be formed to be overlapped with a corresponding one of the openings $OP_{22}$, $OP_{23}$, and $OP_{24}$. The first color conversion pattern TF1, the second color conversion pattern TF2, and the light transmitting pattern TF3 may be formed to be spaced apart from each other with a predetermined interval therebetween.

Referring to FIG. 8G, the second inorganic layer RI2 may be formed on the organic pattern TF. The second inorganic layer RI2 may be formed by depositing at least one of aluminum oxide, silicon oxide, silicon nitride, silicon oxynitride, silicon carbide, titanium oxide, zirconium oxide, and zinc oxide on the organic pattern TF. For example, the deposition process may include a chemical vapor deposition.

The second inorganic layer RI2 may be formed to cover the gap region between the first color conversion pattern TF1, the second color conversion pattern TF2, and the light transmitting pattern TF3. As such, the second inorganic layer RI2 may be formed to be in contact with the first inorganic layer RI1, which has been previously formed in the gap region between the first color conversion pattern TF1, the second color conversion pattern TF2, and the light transmitting pattern TF3. In this manner, the organic pattern TF may be encapsulated by the first inorganic layer RI1 and the second inorganic layer RI2.

Figure 8H:
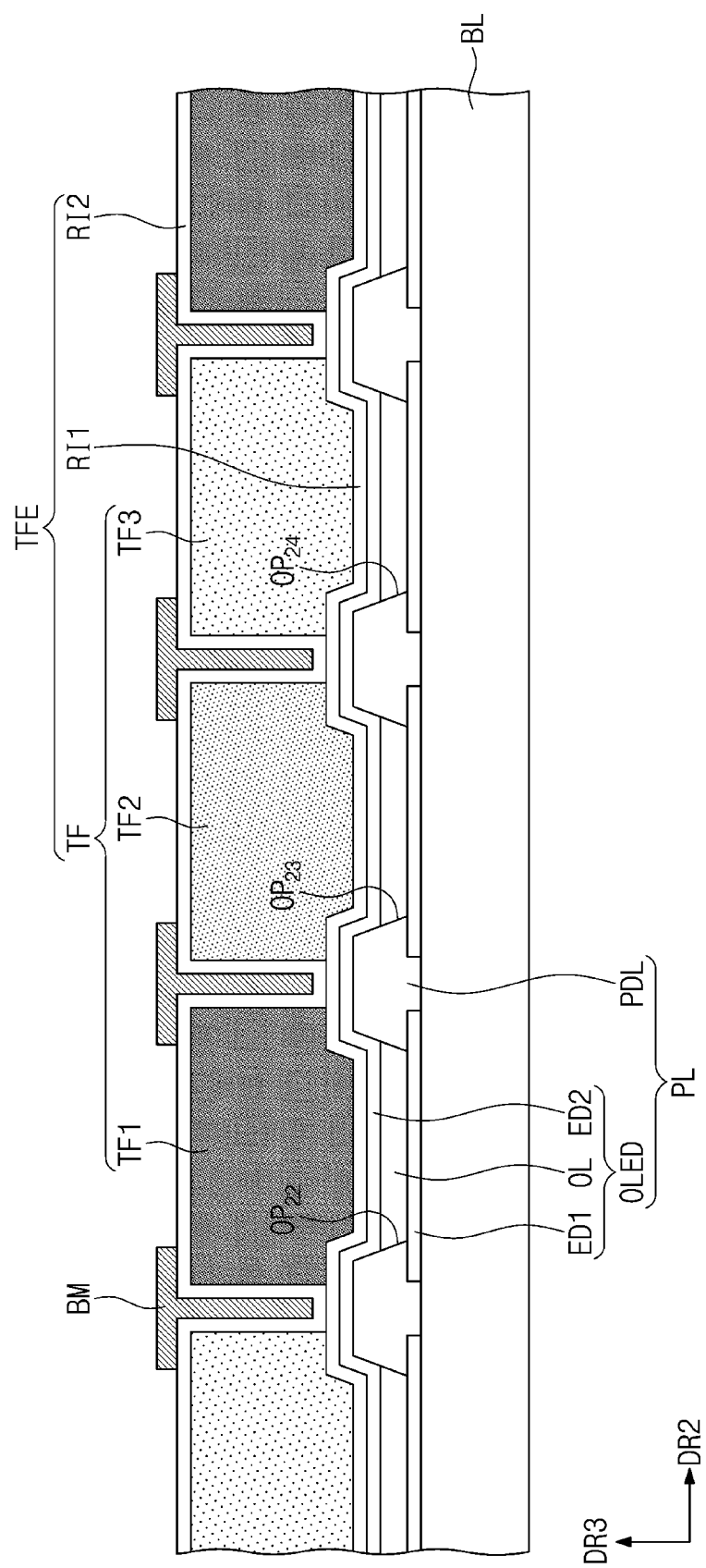

Referring to FIG. 8H, the light-blocking pattern BM may be formed between the first color conversion pattern TF1, the second color conversion pattern TF2, and the light transmitting pattern TF3.

The light-blocking pattern BM may be formed in the gap region between the first color conversion pattern TF1, the second color conversion pattern TF2, and the light transmitting pattern TF3. The light-blocking pattern BM may be formed by forming and patterning a material including metal particles (e.g., of chromium (Cr), silver (Ag), molybdenum (Mo), nickel (Ni), titanium (Ti), or tantalum (Ta)), or oxides of the metal particles) or by performing a photoresist or inkjet process on an organic material including a light blocking material. For example, a material including metal particles for forming the light-blocking pattern BM may be formed on substantially the entire upper surface of the second inorganic layer RI2 across the pixels, and then be patterned to have a substantially "T" shape for each pixel as shown in FIG. 8H. The light-blocking pattern BM may be formed in the gap region between the first color conversion pattern TF1, the second color conversion pattern TF2, and the light transmitting pattern TF3, to prevent or suppress a color mixing issue between the first color conversion pattern TF1, the second color conversion pattern TF2, and the light transmitting pattern TF3.

Figure 8I:
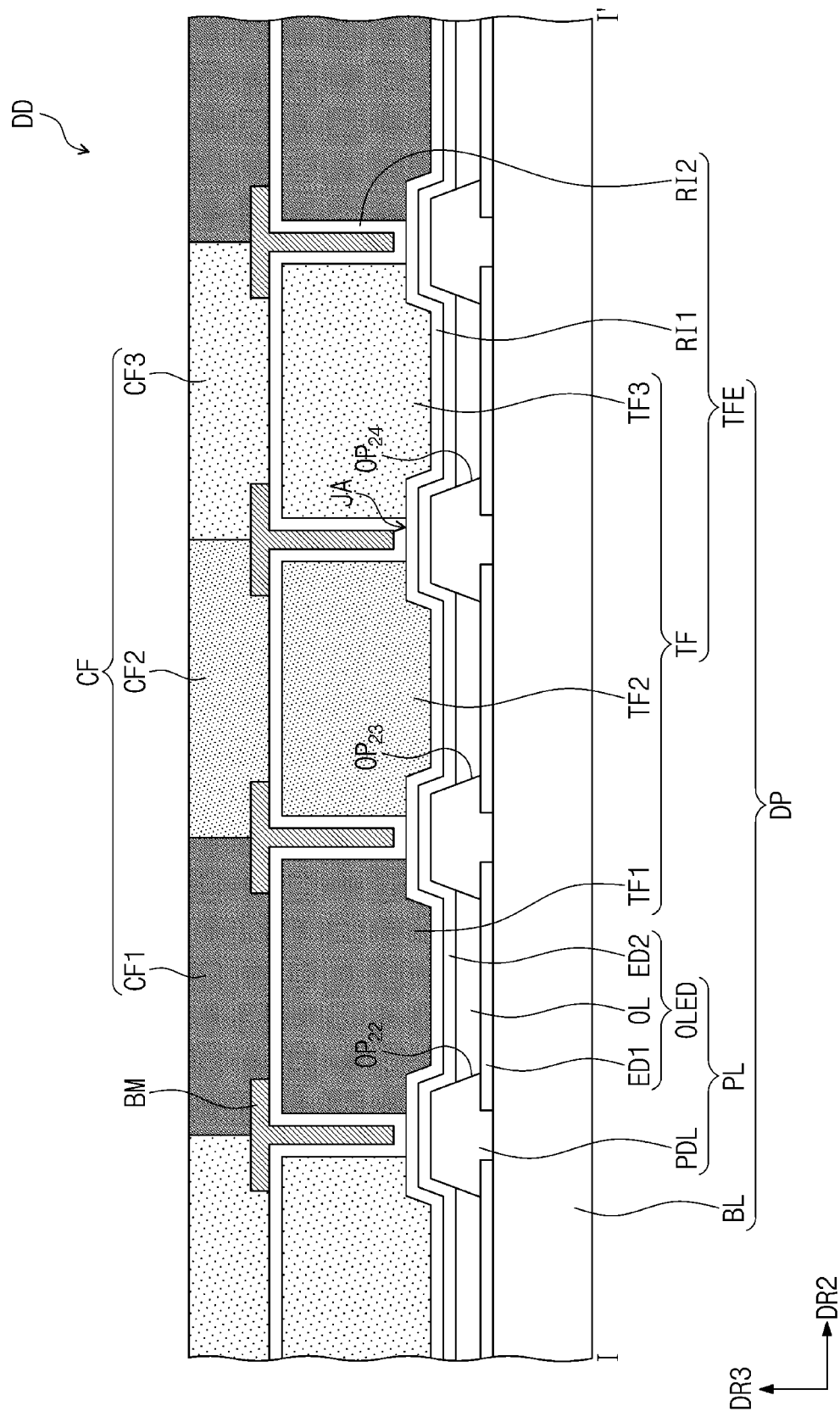

Referring to FIG. 8I, the color filter member CF may be formed on the second inorganic layer RI2. The formation of the color filter member CF may include sequentially forming the first color filter pattern CF1, the second color filter pattern CF2, and the third color filter pattern CF3.

The first color filter pattern CF1, the second color filter pattern CF2, and the third color filter pattern CF3 may include organic materials of different colors. The first color filter pattern CF1, the second color filter pattern CF2, and the third color filter pattern CF3 may be formed to be overlapped with the first color conversion pattern TF1, the second color conversion pattern TF2, and the light transmitting pattern TF3, respectively.

According to an exemplary embodiment, the encapsulation member may include color conversion patterns including quantum dots. As such, a length of a propagation path of light emitted from the organic light emitting element may be shortened, which may improve color reproduction characteristics of the display device. In addition, since a light-blocking pattern is disposed between adjacent ones of the color conversion patterns, a color-mixing issue between the color conversion patterns may be prevented or suppressed, thereby improving the reliability of a display device.

Figure 9C:
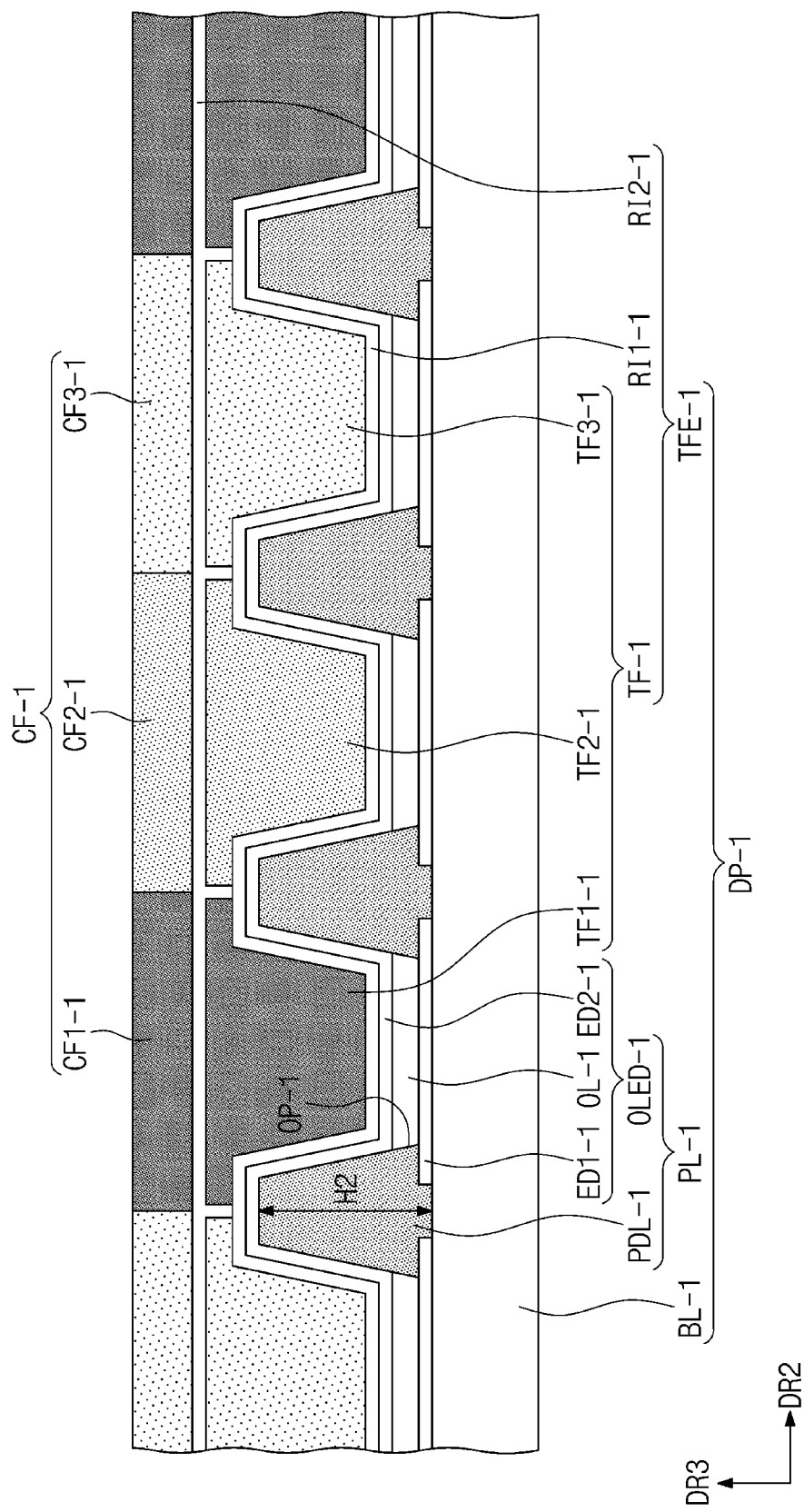

FIGS. 9A to 9C are cross-sectional views illustrating a method of fabricating a display device according to an exemplary embodiment. In the illustrated exemplary embodiment, the method of fabrication will be described with reference to the display device shown in FIG. 5, and repeated descriptions of the elements forming the display device will be omitted to avoid redundancy.

As shown in FIG. 9A, the first electrode ED1-1 may be formed on the base layer BL-1. The first electrode ED1-1 may be formed by patterning an underlying layer including a conductive material, or by depositing a conductive material using a mask.

Thereafter, as shown in FIG. 9B, the pixel definition layer PDL-1 may be formed on the base layer BL-1. In the illustrated exemplary embodiment, an underlying layer including a light blocking material may be formed and patterned using a photolithography process or the like to define a plurality of the openings OP-1 in the underlying layer and thereby to form the pixel definition layer PDL-1. Each of the openings OP-1 may be overlapped with the first electrode ED1-1.

In an exemplary embodiment, the pixel definition layer PDL-1 may be formed to have a thickness H2 in a range of about 3 µm to about 10 µm.

Next, as shown in FIG. 9C, the light emitting layer OL-1 and the second electrode ED2-1 may be formed on the pixel definition layer PDL-1, and then, the encapsulation member TFE-1 may be formed. Thereafter, the color filter member CF-1 may be formed on the encapsulation member TFE-1 to form the display device DD-1.

In an exemplary embodiment, since the pixel definition layer PDL-1 including the light blocking material is formed, a process of separately forming the light-blocking pattern BM may be omitted. As such, the processing time and the costs of fabricating the display device may be reduced.

FIGS. 10A to 10D are cross-sectional views illustrating a method of fabricating a display device according to an exemplary embodiment. In the illustrated exemplary embodiment, the method of fabrication will be described with reference to the display device shown in FIG. 6, and repeated descriptions of the elements forming the display device will be omitted to avoid redundancy.

As shown in FIG. 10A, the first electrode ED1-2 may be formed on the base layer BL-2. The first electrode ED1-2 may be formed by patterning a underlying layer including a conductive material, or by depositing a conductive material using a mask.

Thereafter, as shown in FIG. 10B, the pixel definition layer PDL-2 may be formed on the base layer BL-2. Forming the pixel definition layer PDL-2 may include forming a underlying layer including an insulating material on the base layer BL-2, and patterning the underlying layer using a photolithography process or the like to define a plurality of openings OP-2 in the underlying layer and to form the pixel definition layer PDL-2. Each of the openings OP-2 may be overlapped with the first electrode ED1-2.

Figure 10C:
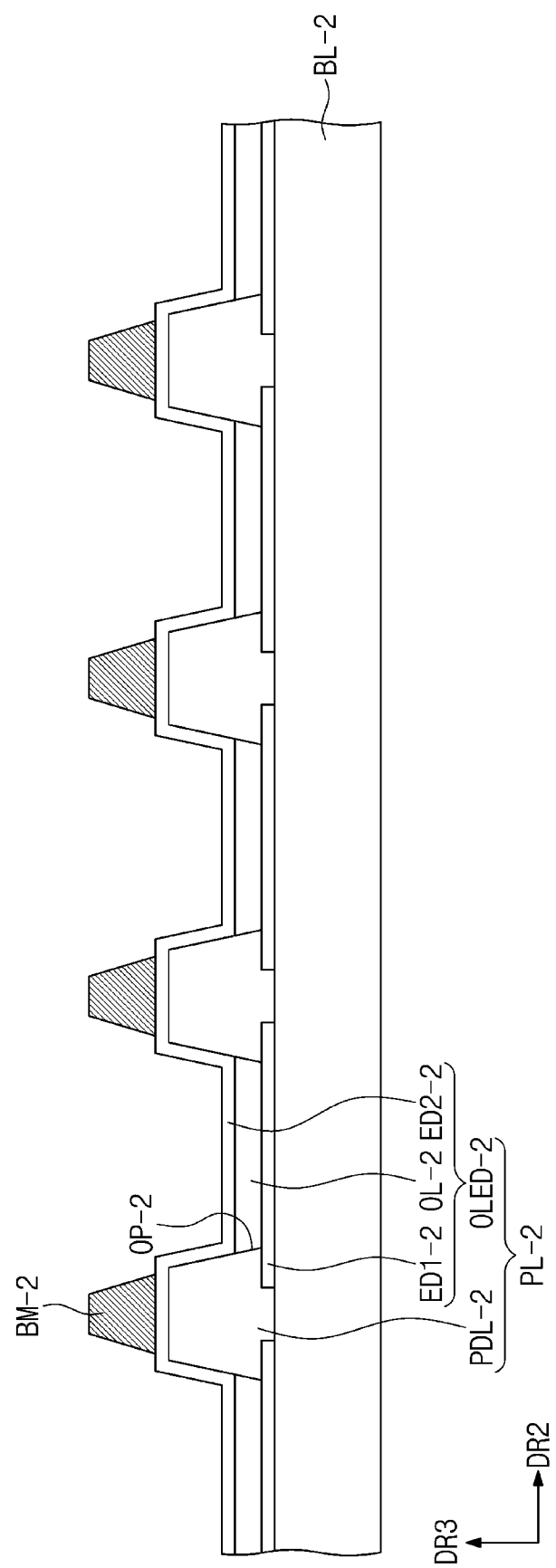

Next, as shown in FIG. 10C, the light emitting layer OL-2 and the second electrode ED2-2 may be sequentially formed on the first electrode ED1-2. Thereafter, the light-blocking pattern BM-2 may be formed on the second electrode ED2-2. The light-blocking pattern BM-2 may be formed to be in contact with a portion of the second electrode ED2-2, which is overlapped with a top surface of the pixel definition layer PDL-2.

Figure 10D:
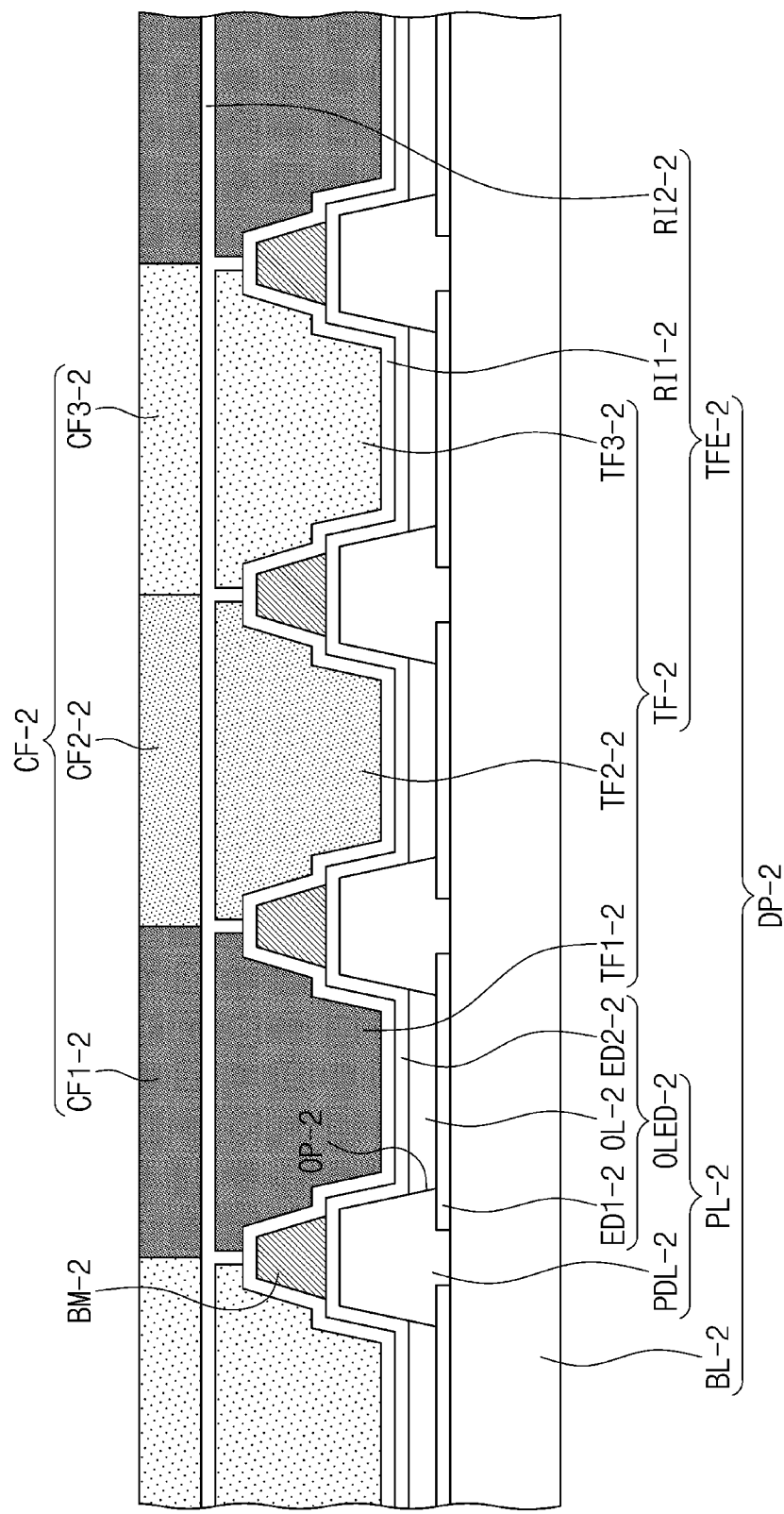

Thereafter, as shown in FIG. 10D, the encapsulation member TFE-2 may be formed. The first inorganic layer RI1-2 of the encapsulation member TFE-2 may be formed after forming the light-blocking pattern BM-2, and the first inorganic layer RI1-2 may cover the light-blocking pattern BM-2. The color filter member CF-2 may be formed on the encapsulation member TFE-2, and as a result, the display device DD-2 may be formed.

Figure 11A:
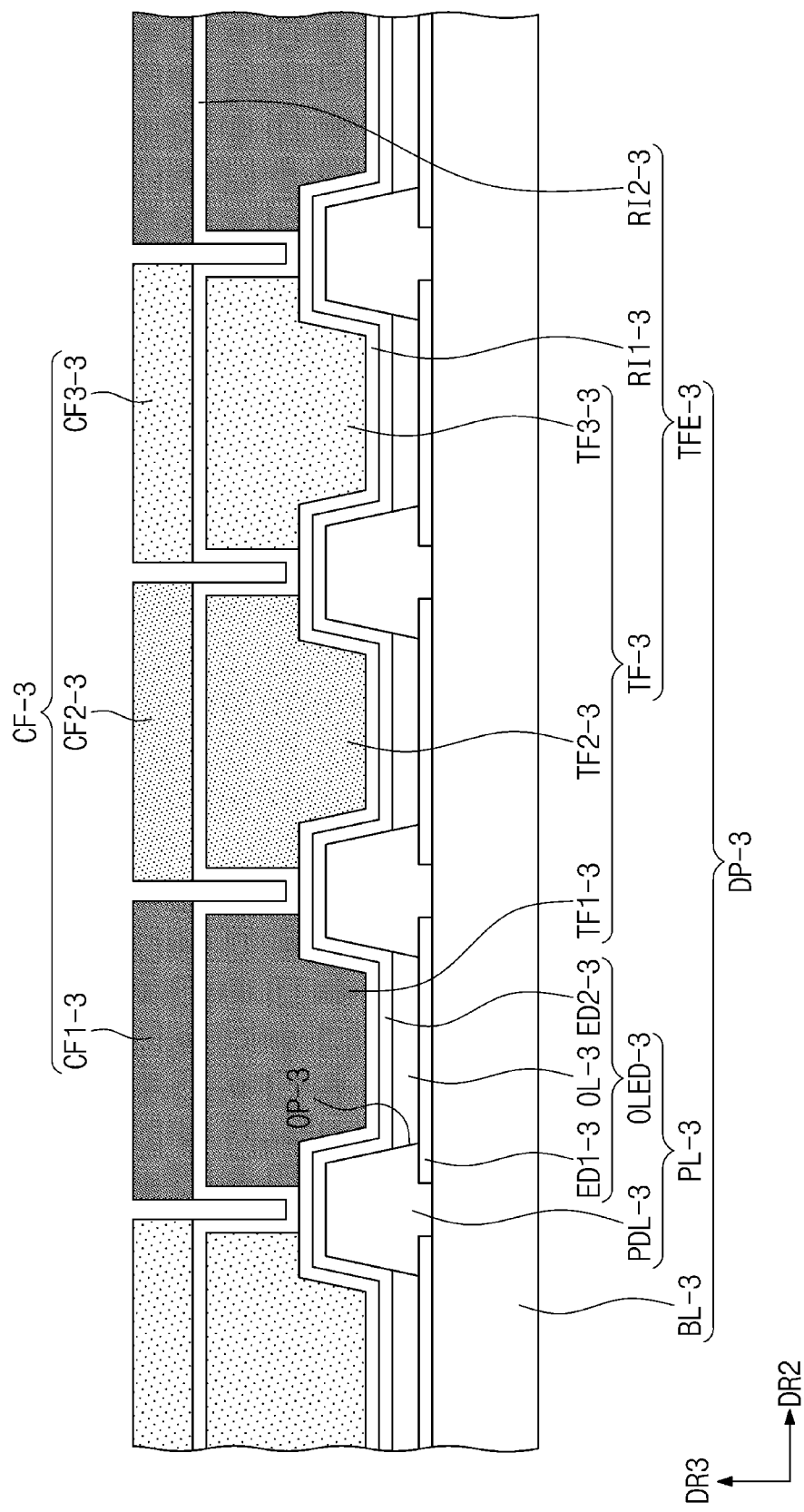
FIGS. 11A to 11B are cross-sectional views illustrating a method of fabricating a display device according to an exemplary embodiment.
Figure 11B:
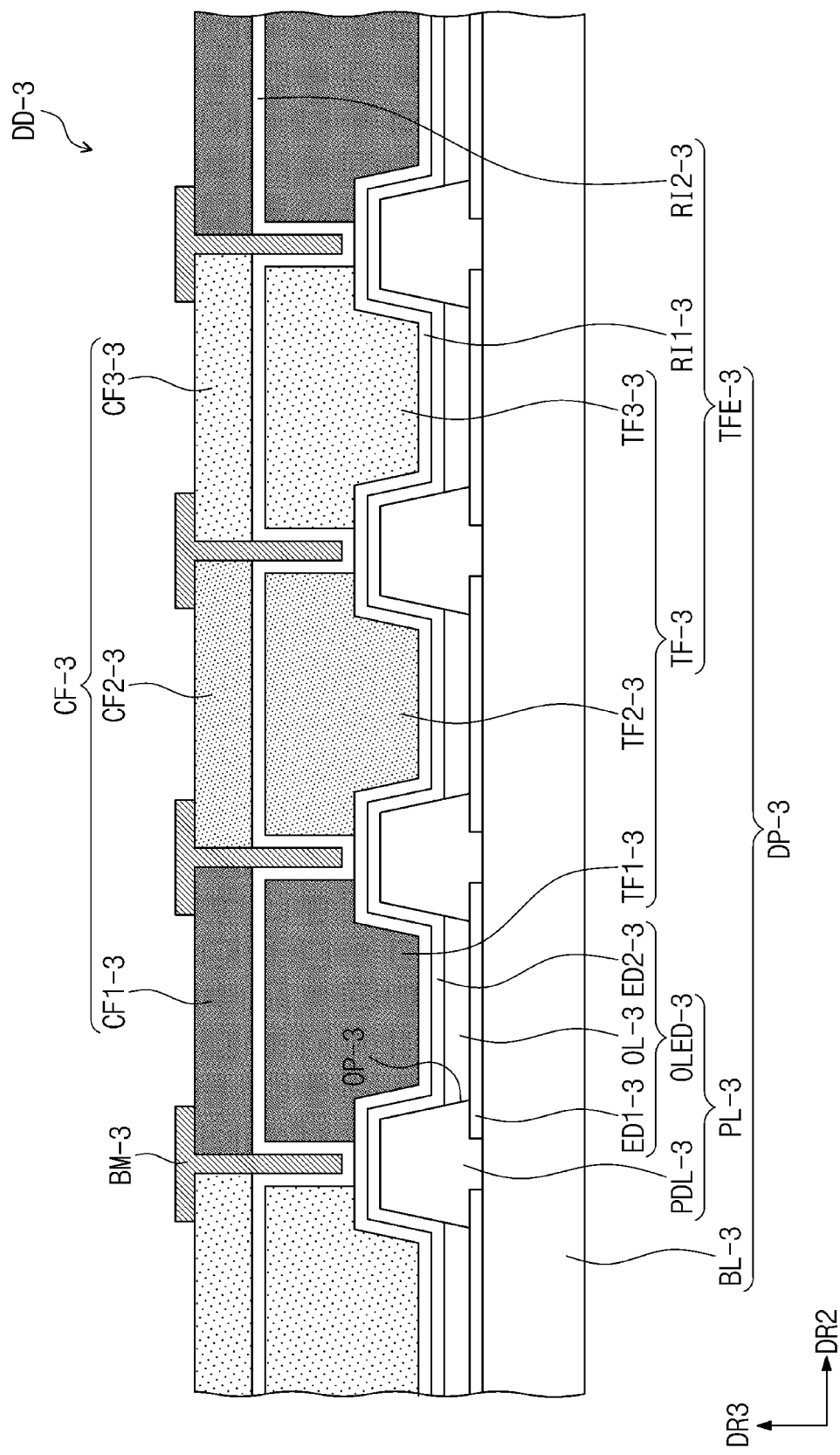

FIGS. 11A to 11B are cross-sectional views illustrating a method of fabricating a display device according to an exemplary embodiment. In the illustrated exemplary embodiment, the method of fabrication will be described with reference to the display device shown in FIG. 7, and repeated descriptions of the elements forming the display device will be omitted to avoid redundancy.

As shown in FIG. 11A, a pixel layer PL-3, an encapsulation member TFE-3, and an color filter member CF-3 may be formed on a base layer BL-3. The color filter patterns CF1-3, CF2-3, and CF3-3 may be formed to be overlapped with the first color conversion pattern TF1-3, the second color conversion pattern TF2-3, and the light transmitting pattern TF3-3, respectively.

The color conversion patterns TF1-3, TF2-3, and TF3-3 may be formed to be spaced apart from each other, and a first inorganic layer RI1-3 and the second inorganic layer RI2-3 may be formed to be in contact with each other in a gap region between the first color conversion pattern TF1, the second color conversion pattern TF2, and the light transmitting pattern TF3.

Thereafter, as shown in FIG. 11B, the light-blocking pattern BM-3 may be formed after forming the color filter member CF-3. Thus, the light-blocking pattern BM-3 may be formed between the first color conversion pattern TF1, the second color conversion pattern TF2, and the light transmitting pattern TF3, which are spaced apart from each other, and between the color filter patterns CF1-3, CF2-3, and CF3-3, which are spaced apart from each other. Since the light-blocking pattern BM-3 is formed after the filter member CF-3 is formed, the light-blocking pattern BM-3 may be extended onto the first to third color filter patterns CF1-3, CF2-3, and CF3-3 and cover a portion of each of the first to third color filter patterns CF1-3, CF2-3, and CF3-3.

According to exemplary embodiments, a display device may have a reduce separation distance from organic light emitting elements to a color filter member. Accordingly, a color mixing issue between lights provided from the organic light emitting elements may be prevented or suppressed, and thereby improving color reproduction characteristics of the display device.

In addition, since an encapsulation member may be formed of substantially the same material as the color filter member, the processing time and costs for fabricating the display device may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a base layer including a thin film transistor;
   a pixel definition layer disposed on the base layer and including an opening;
   first, second, and third organic light emitting elements disposed on the base layer, each of the first, second, and third organic light emitting elements including a first electrode exposed in the opening, a second electrode disposed on the first electrode, and a light emitting layer disposed between the first electrode and the second electrode;
   an encapsulation member comprising:
      a first inorganic layer covering the first, second, and third organic light emitting elements;
      a second inorganic layer disposed on the first inorganic layer;
      a first color conversion pattern disposed between the first and second inorganic layers and overlapping the first organic light emitting element;
      a second color conversion pattern spaced apart from the first color conversion pattern, disposed between the first and second inorganic layers, and overlapping the second organic light emitting element; and
      a light transmitting pattern spaced apart from the first and second color conversion patterns, disposed between the first and second inorganic layers, and overlapping the third organic light emitting element;
   a color filter member disposed on the encapsulation member, the color filter member comprising a first color pattern, a second color pattern, and a third color pattern configured to transmit light having different colors from each other and overlapping the first color conversion pattern, the second color conversion pattern, and the light transmitting pattern, respectively; and
   a light-blocking pattern disposed between the first and second color conversion patterns and the light transmitting pattern,
   wherein each of the first color conversion pattern, the second color conversion pattern, and the light transmitting pattern has a first surface that respectively faces the first, second, and third organic light emitting elements, and a second surface opposite to the first surface,
   wherein the first inorganic layer and the second inorganic layer directly contact the first color conversion pattern, the second color conversion pattern, and the light transmitting pattern, and the second inorganic layer covers the second surface of the first color conversion pattern, the second color conversion pattern, and the light transmitting pattern to encapsulate the first color conversion pattern, the second color conversion pattern, and the light transmitting pattern, respectively, and
   wherein the light-blocking pattern contacts any one of the first inorganic layer and the second inorganic layer in a gap region between the first and second color conversion patterns and the light transmitting pattern.

2. The display device of claim 1, wherein the first inorganic layer and the second inorganic layer contact each other in the gap region formed between the first and second color conversion patterns.

3. The display device of claim 2, wherein the second inorganic layer has a bottom surface facing the top surface of the first inorganic layer and a top surface opposite to the bottom surface thereof and disposed furthest away from the base layer in the second direction, and
   wherein a top surface of each of the first, second, and third color patterns is disposed further away from the base layer in the second direction than the top surface of the second inorganic layer.

4. The display device of claim 1, wherein the light-blocking pattern is disposed on the second inorganic layer and is covered by the color filter member.

5. The display device of claim 1, wherein the light-blocking pattern is covered with the first inorganic layer.

6. The display device of claim 1, wherein the light-blocking pattern overlaps both of the first and second color filter patterns in a direction normal to a longitudinal direction of the base layer.

7. The display device of claim 1, wherein each of the light transmitting pattern and the third color pattern is configured to emit blue light.

8. A display device, comprising:
   a base layer including a thin film transistor;
   a pixel definition layer disposed on the base layer and defined therein an opening and including a light blocking material;
   first, second, and third organic light emitting elements disposed on the base layer, each of the first, second, and third organic light emitting elements including a first electrode exposed in the opening, a second electrode disposed on the first electrode, and a light emitting layer disposed between the first electrode and the second electrode;
   an encapsulation member comprising:
      a first inorganic layer covering the first, second, and third organic light emitting elements;
      a second inorganic layer disposed on the first inorganic layer;
      a first color conversion pattern disposed between the first and second inorganic layers and overlapping the first organic light emitting element;
      a second color conversion pattern spaced apart from the first color conversion pattern, disposed between the first and second inorganic layers, and overlapping the second organic light emitting element; and
      a light transmitting pattern spaced apart from the first and second color conversion patterns, disposed between the first and second inorganic layers, and overlapping the third organic light emitting element; and
   a color filter member disposed on the encapsulation member, such that the second inorganic layer is interposed between the color filter member and the first color conversion pattern, the second color conversion pattern, and the light transmitting pattern, the color filter member comprising a first color pattern, a second color pattern, and a third color pattern configured to transmit light having different colors from each other and overlapping the first color conversion pattern, the second color conversion pattern, and the light transmitting pattern, respectively,
   wherein a thickness of each of the first color conversion pattern, the second color conversion pattern, and light transmitting pattern disposed in the opening is greater than a thickness of each of first color conversion pattern, the second color conversion pattern, and the light transmitting pattern disposed outside the opening.

9. The display device of claim 8, wherein a thickness of the pixel definition layer measured from the base layer is in a range of about 3 μm to about 10 μm.

10. A display device, comprising:
a base layer including a thin film transistor;
a pixel definition layer disposed on the base layer and including an opening;
first and second organic light emitting elements disposed on the base layer, each of the first and second organic light emitting elements comprising a first electrode exposed in the opening, a second electrode disposed on the first electrode, and a light emitting layer disposed between the first electrode and the second electrode;
an encapsulation member comprising:
 a first inorganic layer covering the first and second organic light emitting elements;
 a second inorganic layer disposed on the first inorganic layer;
 a first color conversion pattern overlapping the first organic light emitting element and disposed between the first and second inorganic layers; and
 a second color conversion pattern spaced apart from the first color conversion pattern, disposed between the first and second inorganic layers, and overlapping the second organic light emitting element;
a color filter member disposed on the encapsulation member, the color filter member comprising first and second color filter patterns having different colors from each other and overlapping the first and second color conversion patterns, respectively; and
a light-blocking pattern disposed between the first and second color conversion patterns,
wherein:
the first inorganic layer and the second inorganic layer directly contact the first color conversion pattern and second color conversion pattern to encapsulate the first color conversion pattern and second color conversion pattern;
the first inorganic layer and the second inorganic layer directly contact each other in a gap region between the first and second color conversion patterns; and
the light-blocking pattern contacts any one of the first inorganic layer and the second inorganic layer in a gap region between first and second color conversion patterns.

11. The display device of claim 10, wherein:
a color of light emitted from the first color conversion pattern is the same as a color of the first color filter pattern; and
a color of light emitted from the second color conversion pattern is the same as a color of the second color filter pattern.

12. The display device of claim 10, wherein the second inorganic layer has a bottom surface facing the top surface of the first inorganic layer and a top surface opposite to the bottom surface thereof and disposed furthest away from the base layer in the second direction, and
wherein a top surface of each of the first and second color patterns is disposed further away from the base layer in the second direction than the top surface of the second inorganic layer.

13. The display device of claim 12, wherein the light-blocking pattern is covered with the first inorganic layer.

14. The display device of claim 10, wherein the light-blocking pattern overlaps both of the first and second color filter patterns.

15. The display device of claim 10, wherein the first and second color conversion patterns include a quantum dot.

* * * * *